US012575146B2

(12) United States Patent
Tsai et al.

(10) Patent No.: US 12,575,146 B2
(45) Date of Patent: Mar. 10, 2026

(54) SEMICONDUCTOR STRUCTURE, SEMICONDUCTOR ASSEMBLY AND METHOD FOR MANUFACTURING THE SAME

(71) Applicant: TAIWAN SEMICONDUCTOR MANUFACTURING COMPANY, LTD., Hsinchu (TW)

(72) Inventors: Tsung-Han Tsai, Hsinchu (TW); Ta-Chun Lin, Hsinchu (TW); Chun-Sheng Liang, Hsinchu (TW); Chih-Hao Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 414 days.

(21) Appl. No.: 18/172,608

(22) Filed: Feb. 22, 2023

(65) Prior Publication Data

US 2024/0170533 A1     May 23, 2024

Related U.S. Application Data

(60) Provisional application No. 63/426,842, filed on Nov. 21, 2022.

(51) Int. Cl.

| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 84/01* | (2025.01) |
| *H10D 84/03* | (2025.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 84/0128* (2025.01); *H10D 84/038* (2025.01)

(58) Field of Classification Search
CPC .. H10D 62/121; H10D 88/00; H10D 84/0128; H10D 84/0167; H10D 84/038; H10D 84/85; H10D 30/014; H10D 30/43; H10D 30/6735; H10D 30/6737
USPC ......................................................... 257/288
See application file for complete search history.

(56) References Cited

U.S. PATENT DOCUMENTS

2018/0350586 A1* 12/2018 Cai ...................... H10D 84/853

* cited by examiner

*Primary Examiner* — Fazli Erdem
(74) *Attorney, Agent, or Firm* — Birch, Stewart, Kolasch & Birch, LLP

(57) ABSTRACT

A semiconductor structure includes a first device unit and a second device unit, each of which includes channel features spaced apart from each other, and a dielectric wall disposed between the first and second device units. The dielectric wall includes a first part which includes a plurality of first portions that are in direct contact with the channel features of the first device unit, and a second part which includes a plurality of second portions that are in direct contact with the channel features of the second device unit. At least one of the first and second parts carries positive or negative charges.

20 Claims, 26 Drawing Sheets

SEMICONDUCTOR STRUCTURE, SEMICONDUCTOR ASSEMBLY AND METHOD FOR MANUFACTURING THE SAME

CROSS REFERENCE TO RELATED APPLICATION

This application claims the benefit of U.S. Provisional Patent Application No. 63/426,842, filed on Nov. 21, 2022, which is incorporated by reference herein in its entirety.

BACKGROUND

A forksheet field-effect transistor (FET) may include two nanosheet stacks that are separated by a wall structure. The industry is devoted to improve gate control of the forksheet FET and minimize leakage among different components therein, so as to enhance performance of the forksheet FET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
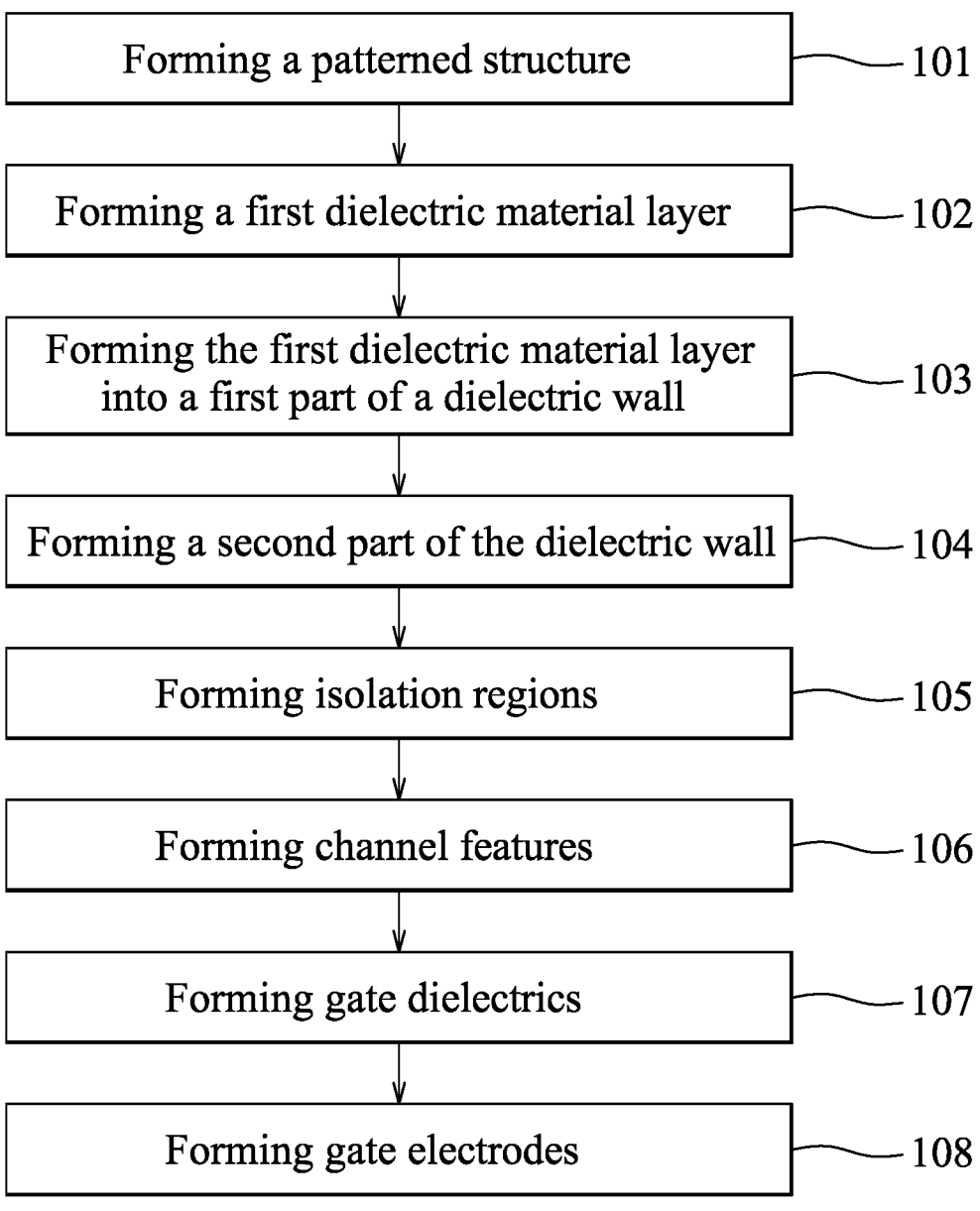
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "bottommost," "upper," "uppermost." "lower," "lowermost," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

The present disclosure is directed to a semiconductor structure, a semiconductor assembly including the semiconductor structure, and methods for manufacturing thereof. The semiconductor structure includes two device units and a dielectric wall that separates the device units. Each of the device units includes a plurality of channel features. The dielectric wall has two parts, each of which includes portions that are respectively in direct contact with the channel features of a corresponding one of the device units. The two parts of the dielectric wall may carry positive or negative charges corresponding to a conductivity type of each of the device units. As such, due to charge repulsion effect, a current leakage between each of the portions of the parts of the dielectric wall and a corresponding one of the channel features of the device units could be minimized, thereby allowing the semiconductor structure to have improved gate control over the channel features. The semiconductor structure may be configured as fork-sheet field-effect transistors (FETs), or other suitable configurations. The devices in the semiconductor structure may be integrated to function as memory cells, inverters, logic gates (e.g., NOR gates and NAND gates), or other suitable applications.

FIG. 1 is a flow diagram illustrating a method for manufacturing the semiconductor structure (for example, the semiconductor structure 100 shown in FIG. 10) in accordance with some embodiments. FIGS. 2 to 12 illustrate schematic views of intermediate stages of the method in accordance with some embodiments. Some repeating structures are omitted in FIGS. 2 to 12 for the sake of brevity. Additional steps can be provided before, after or during the method, and some of the steps described herein may be replaced by other steps or be eliminated.

Figure 2:
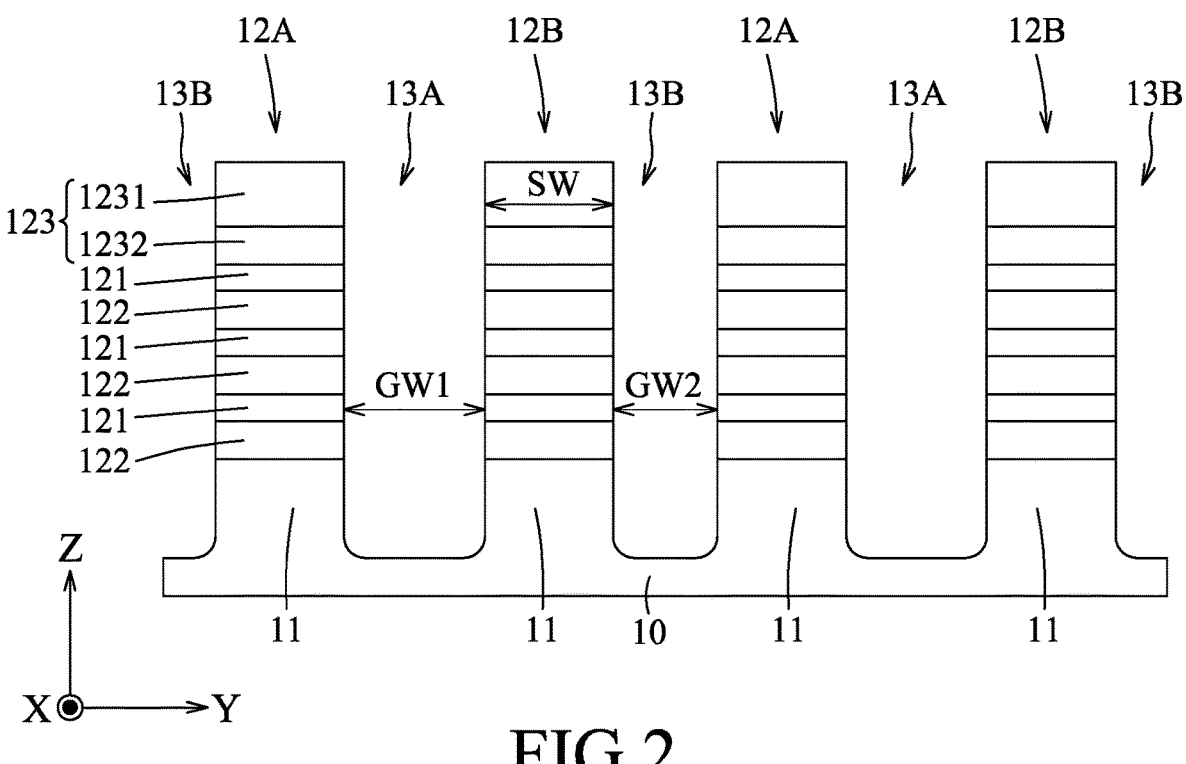
FIGS. 2 to 16 are schematic views illustrating intermediate stages of the method for manufacturing the semiconductor structure in accordance with some embodiments.

Referring to FIG. 1 and the example illustrated in FIG. 2, the method begins at step 101, where a patterned structure is formed to include a substrate 10, a plurality of pairs of fins 11 (two pairs of the fins 11 are shown) disposed on the substrate 10, and a plurality of pairs of stacks (two pairs of the stacks are shown). Each pair of the stacks is disposed on a corresponding pair of the fins 11, and includes a first stack 12A and a second stack 12B. In some embodiments, the fins 11 are each elongated in an X direction, and are spaced apart from each other in a Y direction transverse to the X direction.

In some embodiments, the substrate 10 may be, for example, but not limited to, a silicon-on-insulator (SOI) substrate, a germanium-on-insulator (GOI) substrate, a bulk semiconductor substrate (e.g., a bulk silicon substrate) or the like. The substrate 10 may have multiple layers. The substrate 10 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The substrate 10 may be intrinsic or doped with a dopant or different dopants. Other suitable materials and/or configurations for the substrate 10 are within the contemplated scope of the present disclosure.

Each of the fins 11 may be made of a material the same as or different from that of the substrate 10 as described above. The material for forming the fins 11 may be doped with p-type impurities or n-type impurities, or undoped. In some embodiments, when one of the fins 11 is designed for forming an n-type FET thereon, the one of the fins 11 may be doped with p-type impurities; and when one of the fins 11 is designed for forming a p-type FET thereon, the one of the fins 11 may be doped with n-type impurities so as to reduce a substrate current leakage.

Each of the first and second stacks 12A, 12B includes a plurality of channel layers 121 and a plurality of sacrificial layers 122 disposed to alternate with the channel layers 121 in a Z direction transverse to both the X and Y directions. In some embodiments, the X, Y, and Z directions are perpendicular to one another. In some embodiments, an uppermost one of the channel layers 121 is disposed over an uppermost one of the sacrificial layers 121. The number of the channel layers 121 and the sacrificial layers 122 in each of the stacks 12 is determined according to application requirements. In FIG. 2, in each of the stacks 12, the number of the channel layers 122 and the number of the sacrificial layers 121 are both three. Suitable materials for the channel layers 121 and the sacrificial layers 122 are similar to those for the substrate 10, but the material of the channel layers 121 is different from that of the sacrificial layers 122, so that the sacrificial layers 122 can be selectively removed with respect to the material of the channel layers 121 during subsequent processes. In some embodiments, each of the channel layers 121 is made of a silicon-based semiconductor material. In some embodiments, each of the channel layers 121 is made of silicon (Si), and each of the sacrificial layers 122 is made of silicon germanium (SiGe). Other suitable materials and/or configurations for the sacrificial layers 121 and the channel layers 122 are within the contemplated scope of the present disclosure.

In some embodiments, each of the first and second stacks 12A, 12B has a stack width (SW) in the Y direction which may be adjustable and determined in step 101 and will affect a channel width (CW) in the Y direction of channel features 121B (see FIG. 10) to be subsequently formed from the channel layers 121. In some embodiments, the stack width (SW) ranges from about 5 nm to about 50 nm, and the channel width (CW) may be substantially the same as or slightly less than the stack width (SW), and may range from about 5 nm to about 50 nm. In addition, in each pair of the stacks, the first and second stacks 12A, 12B are spaced apart from each other by a first gap 13A which has a gap width (GW1) that ranges from about 1 nm to about 100 nm in the Y direction. Each two adjacent pairs of the stacks are spaced apart from each other by a second gap 13B (GW2) that ranges from about 1 nm to about 100 nm in the Y direction.

In some embodiments, each of the first and second stacks 12A, 12B further includes a mask layer 123 disposed on the uppermost one of the channel layers 121. The mask layer 123 may include at least one low k material (such as silicon oxide, silicon nitride, silicon oxynitride, silicon carbonitride, silicon oxycarbide, silicon oxycarbonitride, silicon carbide, and so on), at least one high k material (such as hafnium oxide, zirconium oxide, zirconium aluminum oxide, hafnium aluminum oxide, hafnium silicon oxide, aluminum oxide, and so on), or combinations thereof. In some embodiments, the mask layer 123 includes an upper mask film 1231 and a lower mask film 1232 which is made of a material different from that of the upper mask film 1231. In some embodiments, the lower mask film 1232 includes silicon nitride and the upper mask film 1231 includes an oxide-based material (such as silicon oxide, hafnium oxide, and so on). Other suitable materials and/or configurations for the mask layer 123 are within the contemplated scope of the present disclosure.

Figure 3:
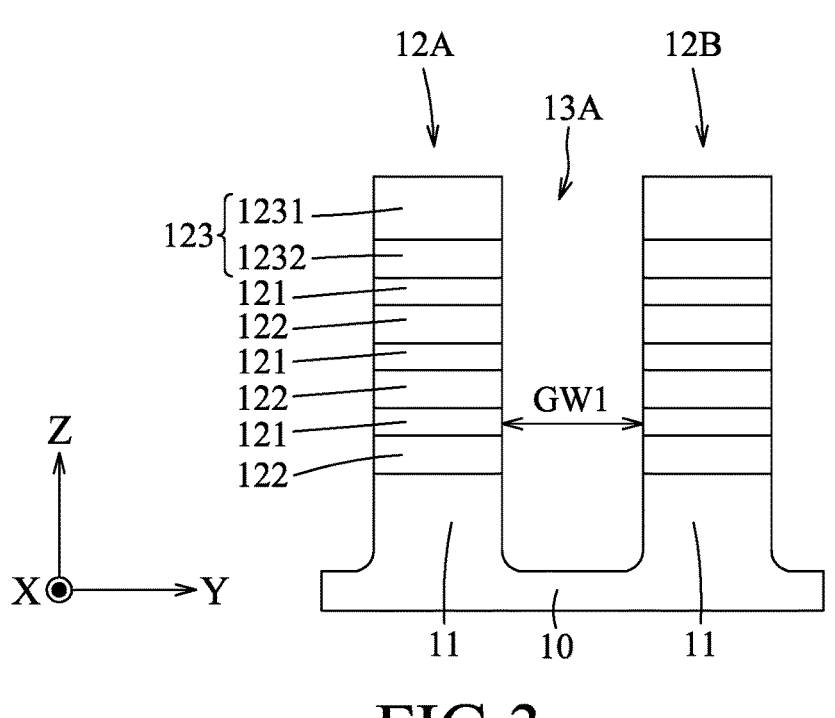

In some embodiments, the patterned structure may be formed by patterning a semiconductor substrate and a stack unit (not shown) formed thereon to form the fins 11 on the substrate 10 and the stacks respectively on the fins 11 (i.e., the semiconductor substrate is patterned into the substrate 10 and the fins 11, and the stack unit is patterned into the stacks). Other suitable processes and/or configurations for the patterned structure are within the contemplated scope of the present disclosure. FIG. 3 is a partially enlarged view of FIG. 2, showing a single pair of the fins 11 and a single pair of the stacks (i.e., one first stack 12A and one second stack 12B). In each of the first and second stacks 12A, 12B, each of the channel layers 121 has an end portion exposed from the first gap 13A. In the following steps illustrated with reference to FIGS. 4 to 10 are subsequent to the structure shown in FIG. 3.

Figures 4, 5:
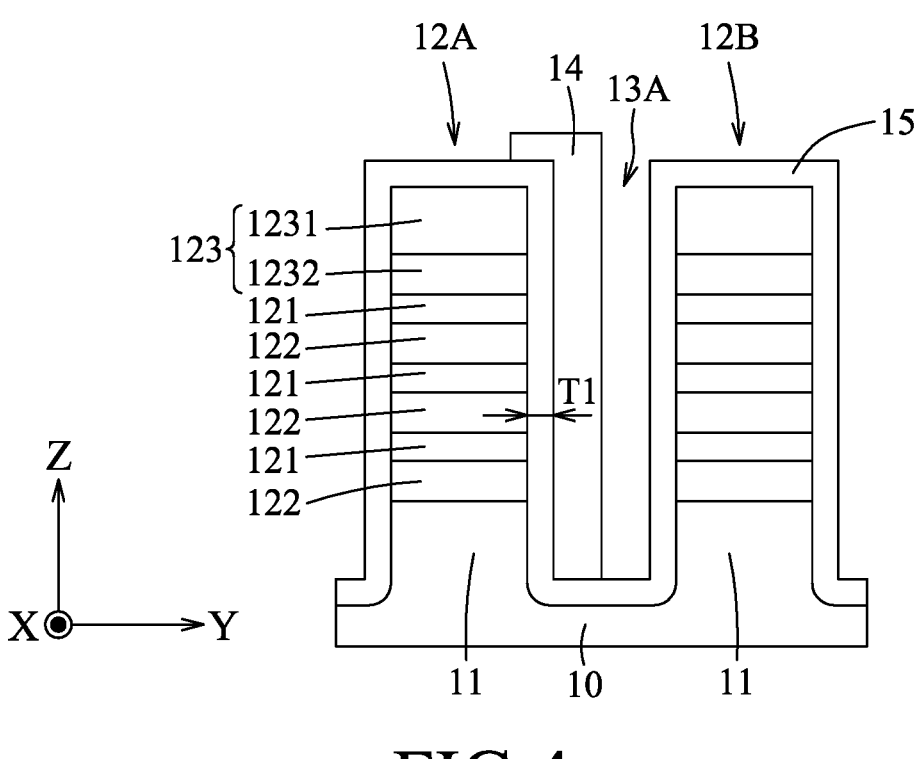

Referring to FIG. 1 and the example illustrated in FIG. 4, the method proceeds to step 102, where a first dielectric material layer 15 is formed over the structure shown in FIG. 3, i.e., over the first and second stacks 12A, 12B, the fins 11 and the substrate 10.

The first dielectric material layer 15 is to be formed into a first part 161 of the dielectric wall 16 (see FIG. 6) in steps performed subsequently. In some embodiments, the first dielectric material layer 15 has a thickness (T1) ranging from about 1 Å to about 40 nm.

In some embodiments, the first dielectric material layer 15 is made of a first dielectric material which may include silicon oxide, silicon carbide nitride, silicon nitride, hafnium silicate, hafnium oxide, lanthanum oxide, lanthanum aluminum oxide, aluminum oxide, yttrium oxide, zirconium oxide, tantalum oxide, niobium oxide, titanium oxide, barium titanate, strontium titanate or combinations thereof. Other suitable materials for forming the first dielectric material layer 15 are within the contemplated scope of the present disclosure.

In some embodiments, the first dielectric material layer 15 is formed using a suitable process, such as chemical vapor deposition (CVD), atomic layer deposition (ALD), and/or other suitable techniques.

After formation of the first dielectric material layer 15, in some embodiments, a masking material layer 14 is formed, so that a first portion of the first dielectric material layer 15 that is in direct contact with the channel layer 121 of the first stack 12A is masked. The masking material layer 14 may include, for example but not limited to, oxides, nitrides, a carbon-based material, or a polymer. In some embodiments, the polymer may include, for example, but not limited to a bottom anti-reflective coating (BARC). In some embodiments, the BARC is prepared from 4-vinylphenol monomers (to form polyvinylphenol polymer) or styrene monomers (to form polystyrene polymer). Other suitable materials for forming the masking material layer 14 are within the contemplated scope of the present disclosure. In some embodiments, the masking material layer 14 may be formed by sub-steps of: (i) forming a material layer for forming the masking material layer 14 using a suitable process, such as chemical vapor deposition (CVD), atomic layer deposition (ALD), and/or other suitable techniques; and (ii) patterning the material layer to expose a second portion of the first dielectric material layer 15 that covers the channel layers 121 of the second stack 12B and a portion of the substrate 10, to thereby form the masking material layer 14.

Referring to FIG. 1 and the example illustrated in FIG. 5, the method proceeds to step 103, where the first dielectric layer 15 is formed into the first part 161 which is in direct contact with the end portions of the channel layers 121 of the first stack 12A.

In some embodiments, step 103 includes sub-steps of: (i) removing the second portion of the first dielectric layer 15 exposed from the masking material layer 14 shown in FIG. 4 using etching or other suitable techniques, thereby forming the first part 161; and (ii) removing the masking material layer 14. When an etching process is used in sub-step (i), a wet etchant used has a higher etching selectivity to the first dielectric layer 15 than to the upper mask film 1231, the channel layers 121, the sacrificial layers 122, the fins 11 and the substrate 10. After step 103, the first part 161 formed is in direct contact with and covers the end portions of the channel layers 121 of the first stack 12A, while the channel layers 121 of the second stack 12B, in addition to a portion of the substrate 10 and a portion of a corresponding one of the fins 11 located below the second stack 12B, are exposed through the first gap 13A.

Figure 6:
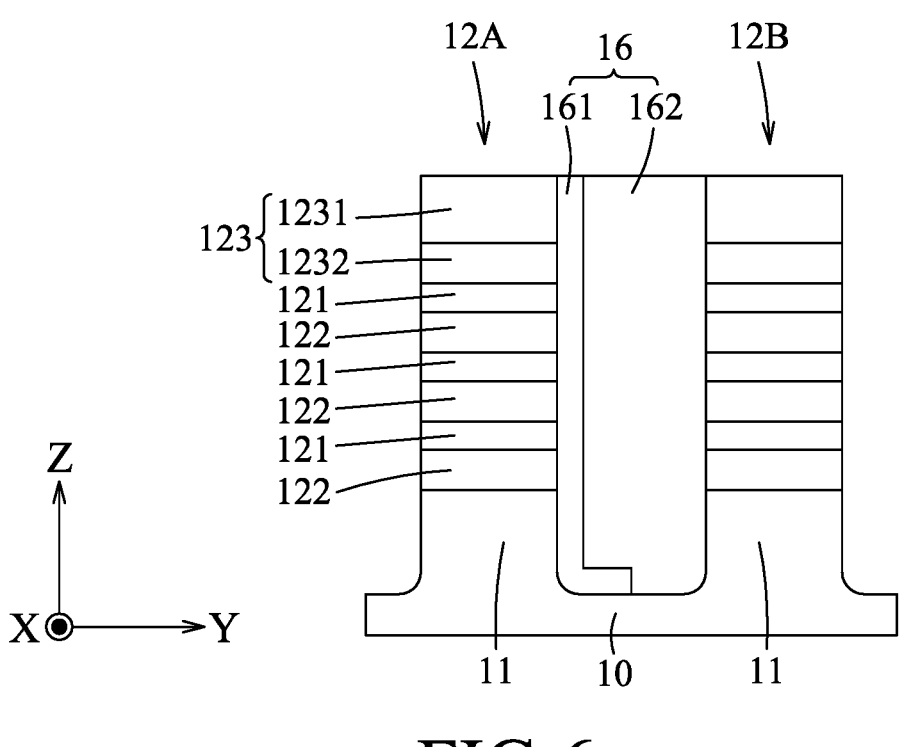

Referring to FIG. 1 and the example illustrated in FIG. 6, the method proceeds to step 104, where a second part 162 is formed to be in direct contact with the end portions of the channel layers 121 of the second stack 12B.

In some embodiments, step 104 includes sub-steps of: (i) forming a patterned masking layer (not show) over the structure shown in FIG. 5 to expose the first gap 13A; (ii) filling a second dielectric material (not shown) for forming the second part 162 in the first gap 13A (see also FIG. 5) using any suitable deposition process, such as CVD; (iii) removing an excess of the second dielectric material by for example, but not limited to, a chemical-mechanical planarization (CMP) process, other suitable techniques, or combinations thereof, thereby forming the second part 162 of the dielectric wall 16; and (iv) removing the patterned masking layer. By completing step 104, the second part 162, together with the first part 161, form the dielectric wall 16. Other suitable materials and/or method for forming the dielectric wall 16 are within the contemplated scope of the present disclosure.

Possible materials for the second dielectric material (i.e., the second part 162) are similar to those for the first dielectric material (i.e., the first part 161). Depending on practical needs, the second dielectric material may be the same as, or different from the first dielectric material as described with reference to step 102, and details are omitted for the sake of brevity. Other suitable materials for forming the second part 162 are within the contemplated scope of the present disclosure.

Figure 7:
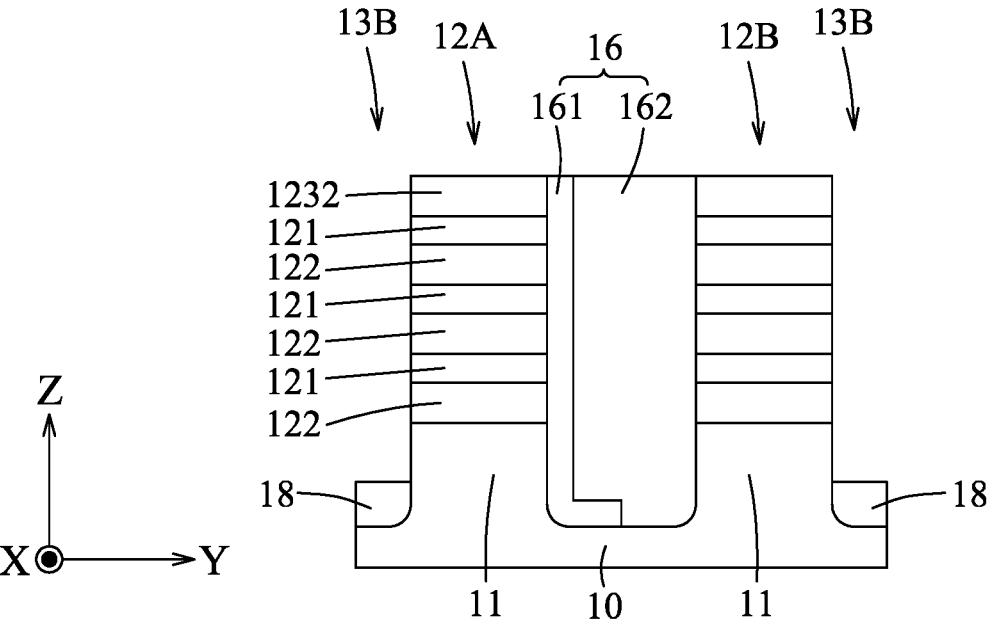

Referring to FIG. 1 and the example illustrated in FIG. 7, the method proceeds to step 105, where a plurality of isolation regions 18 are respectively formed in the second gaps 13B between each adjacent pairs of the fins 11 (see also FIG. 2).

In some embodiments, each of the isolation regions 18 may be a portion of a shallow trench isolation (STI), a deep trench isolation (DTI), or other suitable structures. The isolation regions 18 may include a suitable low k material (such as the examples described in the preceding paragraph). Other suitable materials and/or configurations for the isolation regions 18 are within the contemplated scope of the present disclosure.

In some embodiments, the isolation regions 18 may be formed by the following sub-steps: (i) filling an isolation material (not shown) for forming the isolation regions 18 in the second gaps 13B using any suitable deposition process, such as CVD; (ii) removing an excess of the isolation material by for example, but not limited to, a chemical-mechanical planarization (CMP) process, other suitable techniques, or combinations thereof; and (iii) etching back the remaining isolation material, thereby obtaining the isolation regions 18. In some embodiment, during removing the excess of the isolation material, the upper mask film 1231 (see also FIG. 6) is also removed to expose the lower mask film 1232. Other suitable process for forming the isolation regions 18 are within the contemplated scope of the present disclosure.

Figure 8:
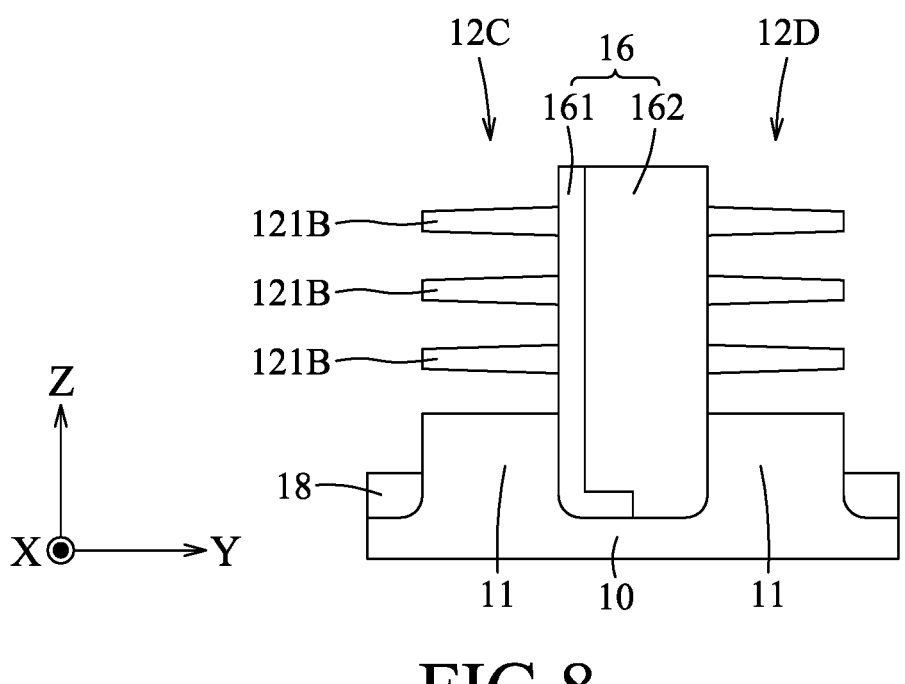

Referring to FIG. 1 and the examples illustrated in FIGS. 7 and 8, the method proceeds to step 106, where the first and second stacks 12A, 12B are patterned, such that the channel layers 121 are formed into channel features 121B and the sacrificial layers 122 are removed.

To obtain the structure shown in FIG. 8, in some embodiments, step 106 may include following sub-steps: (i) removing the lower mask film 1232 shown in FIG. 7; (ii) forming a dummy gate structure (not shown) which is elongated in the Y direction over the first and second stacks 12A, 12B shown in FIG. 7, and which may include a dummy gate dielectric and a dummy gate electrode; (iii) forming a pair of gate spacers 171 (see also FIGS. 11 and 12) at two opposite sides of the dummy gate structure; (iv) etching portions of each of the first and second stacks 12A, 12B which are exposed from the dummy gate structure and the gate spacers 171 to form source/drain recesses (not shown) such that the channel layers 121 and the sacrificial layers 122 in each of the first and second stacks 12A, 12B are patterned into channel features 121B (see FIG. 8) and sacrificial features (not shown); (v) replacing end portions of the sacrificial features with a plurality of inner spacers 172 (see also FIG. 12); (vi) forming source/drain features 173 (see also FIG. 12) respectively in the source/drain recesses; (vii) forming a contact etch stop layer 174 and an interlayer dielectric layer 175 (see also FIGS. 11 and 12) over each of the source/drain features 173; and (viii) removing the dummy gate electrode, the dummy gate dielectric and the remaining sacrificial features. The first and second stacks after step 106 are then respectively denoted as 12C, 12D. Other suitable processes for forming the structure shown in FIG. 8 are within the contemplated scope of the present disclosure.

Figure 9:
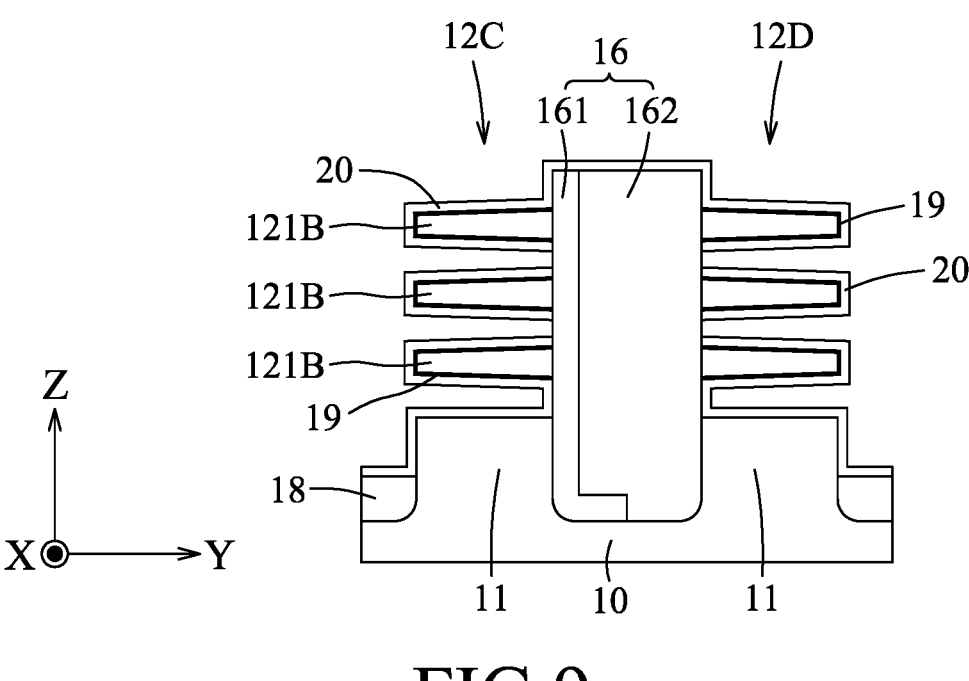

Referring to FIG. 1 and the example illustrated in FIG. 9, the method proceeds to step 107, where two gate dielectrics 20, each of which is formed over (i) one of the first and second stacks 12C, 12D, and (ii) the dielectric wall 16, a corresponding one of the fins 11 and a corresponding one of the isolation regions 18. The gate dielectrics 20 may be merged with each other on an upper surface of the dielectric wall 16.

In some embodiments, the gate dielectrics 20 are made of a high dielectric constant material, such as the dielectric material having a dielectric constant ranging from about 7 to about 25. In other embodiments, the gate dielectrics 20 are made of, for example, but not limited to, the high k materials as mentioned above, Hf-based dielectric materials, Zr-based dielectric materials, Al-based dielectric materials, Ti-based dielectric materials, Ba-based dielectric materials, nitrides, or the like, or combinations thereof. In some embodiments, the gate dielectrics 20 may be formed using CVD, PVD, or other suitable techniques. Other suitable materials and processes for forming the gate dielectrics 20 are within the contemplated scope of the present disclosure.

In some embodiments, prior to forming the gate dielectrics 20, a plurality of interfacial layers 19 are respectively formed around the channel features 121B of each of the first and second stacks 12C, 12D, and the gate dielectrics 20 are each formed over the interfacial layers 19 on a corresponding one of the first and second stacks 12C, 12D. The interfacial layers 19 may serve as a buffer layer for facilitating growth of a layer to be subsequently formed thereon, and may be made of a suitable low dielectric constant material such as silicon oxide, silicon nitride, silicon oxynitride, or combinations thereof. In some embodiments, the interfacial layers 19 are formed using CVD, ALD, thermal oxidation, or wet chemical oxidation. Other suitable techniques and materials for forming the interfacial layers 19 are within the contemplated scope of the present disclosure.

Figure 10:
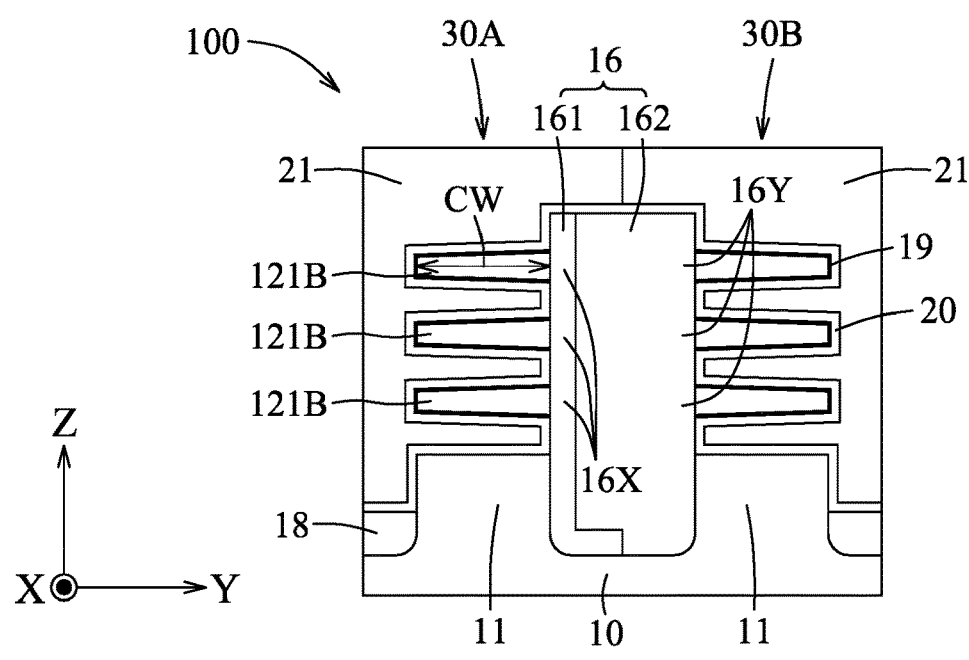
Figure 11:
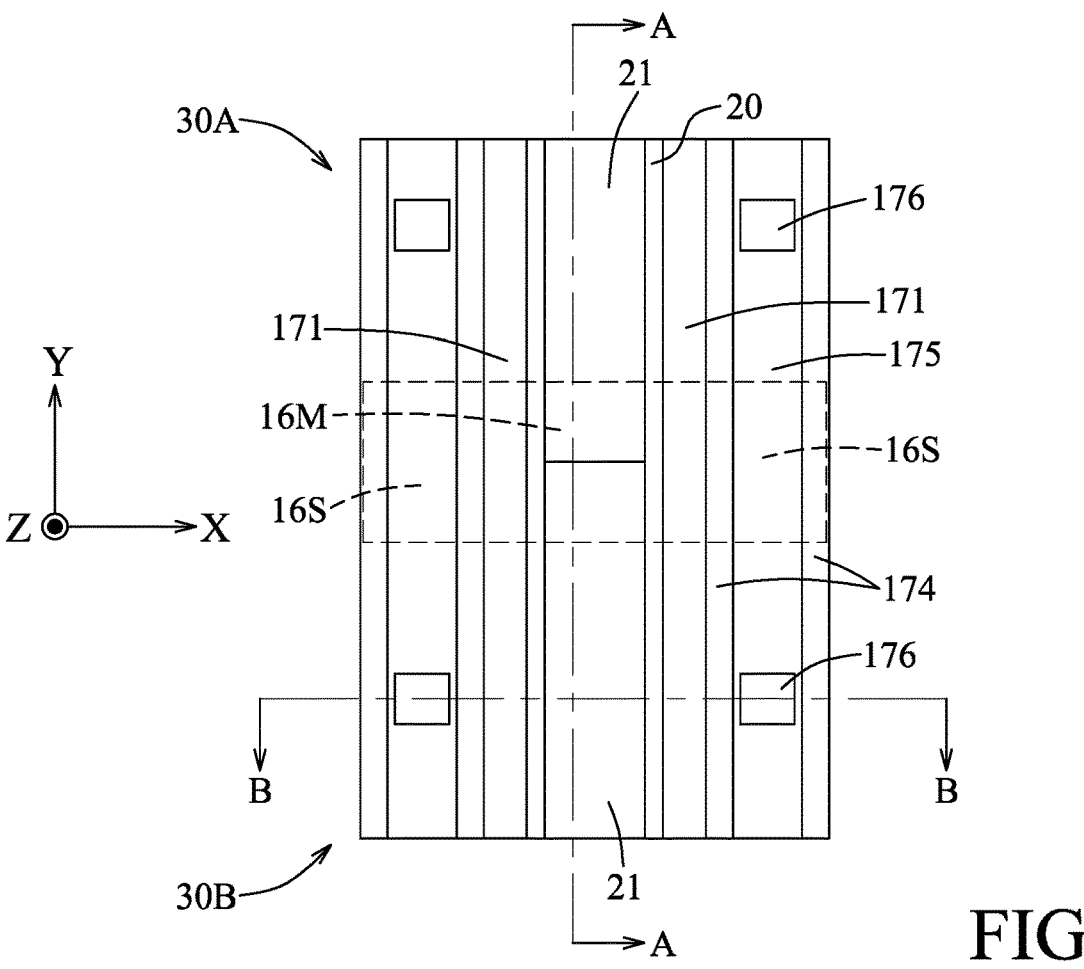
Figure 12:
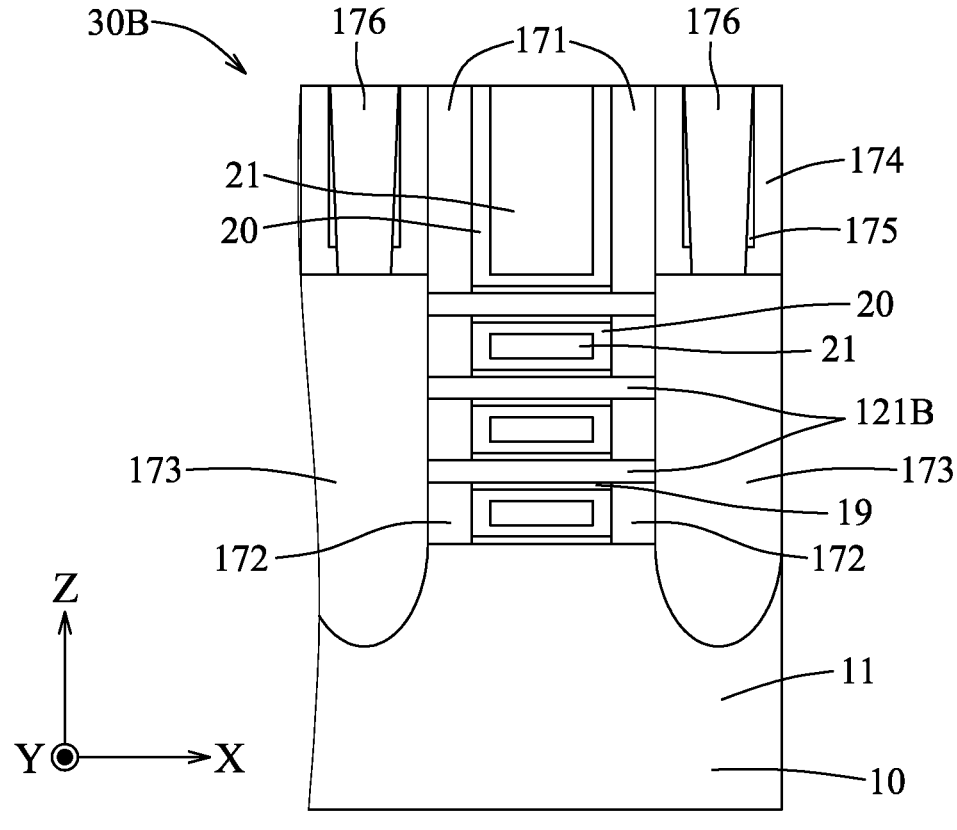

Referring to FIG. 1 and the example illustrated in FIGS. 10 to 12, the method proceeds to step 108, where two gate electrodes 21, each of which is formed to extend around the channel features 121B of each of the first and second stacks 12C, 12D and disposed on a corresponding one of side surfaces of the dielectric wall 16. Each of the gate electrodes 21 is separated from the channel features 121B of the corresponding one of first and second stacks 12C, 12D (see also FIG. 9) and the dielectric wall 16 by a corresponding one of the gate dielectrics 20. Each of the gate electrodes 21 and the corresponding one of the gate dielectrics 20 form a gate feature around the channel features 121B of the corresponding one of first and second stacks 12C, 12D. A first device unit 30A and a second device unit 30B are thereby formed. Each of the first and second device units 30A, 30B includes the channel features 121B of a corresponding one of the first and second stacks 12C, 12D corresponding ones of the interfacial layers 19, a corresponding one of the gate dielectrics 20, and a corresponding one of the gate electrodes 21.

In some embodiments, each of the gate electrodes 21 may be configured as a multi-layered structure including at least one work function metal which is provided for adjusting threshold voltage of an n-type device or a p-type device, an electrically conductive material having a low resistance which is provided for reducing electrical conductivity of the gate electrodes 21, other suitable materials, or combinations thereof. In some embodiments, the two gate electrodes 21 may be made of the same or different materials. For instance, in some embodiments, when the first device unit 30A and the second device unit 30B are respectively an n-type device and a p-type device, the work function metal for the gate electrode 21 of the n-type device may be different from the work function metal for the gate electrode 21 of the p-type device, so as to permit the n-type device and the p-type device to have different threshold voltages. In some embodiments, the gate electrodes 21 are merged with each other on the upper surface of the dielectric wall 16. In some embodiments, each of the gate electrodes 21 independently include a conductive material such as, for example, but not limited to, a metal (e.g., copper, aluminum, titanium, tantalum, cobalt, tungsten, or the like, or alloys thereof), polysilicon, metal-containing nitrides (e.g., TaN), metal-containing silicides (e.g., NiSi), metal-containing carbides (e.g., TaC), or the like, or combinations thereof. Other suitable materials for forming the gate electrodes 21 are within the contemplated scope of the present disclosure.

In some embodiments, when the two gate electrodes 21 are different materials, step 108 may include sub-steps of: (i) depositing a first electrode material (for example, the material for forming the gate electrode 21 of the device unit 30A shown in FIG. 10) over the first and second stacks 12C, 12D shown in FIG. 9 using CVD, ALD or other suitable techniques; (ii) performing a planarization process such as CMP or other suitable techniques; (iii) forming a mask (not shown) on a left portion of the planarized first electrode material and over the first stack 12C, exposing a right portion of the planarized first electrode material; (iv) removing the right portion of the planarized first electrode material deposited over the second stack 12D, followed by removing the mask; (v) depositing a second electrode material over the second stack 12D and the left portion of the planarized first electrode material using CVD, ALD or other suitable techniques; and (vi) removing an excess of the second electrode material using, for example, CMP to expose the left portion of the planarized first electrode material. The gate electrode 21 of the first stack 12C is thereby formed from the first electrode material, and the gate electrode 21 of the second stack 12D is thereby formed from the second electrode material. In some other embodiments, the second electrode material may be deposited, planarized and partially removed first, and then the first electrode material is deposited and partially removed. The Other suitable techniques for forming the gate electrodes 21 are within the contemplated scope of the present disclosure.

After completing step 108, the semiconductor structure 100 is obtained. FIG. 11 shows a top view of the semiconductor structure 100 in accordance with some embodiments. In some embodiments, a cross-sectional view of the semiconductor structure 100 along the line A-A of FIG. 11 is illustrated in FIG. 10, and a cross-sectional view of the semiconductor structure 100 along the line B-B of FIG. 11 is illustrated in FIG. 12. In some embodiments, the method may further include a step of forming metal-to-device (MD) contacts 176 (see FIGS. 11 and 12). Each of the MD contacts 176 is in electrically contact with a corresponding one of the source/drain features 173 of the first and second device units 30A, 30B, and each of the source/drain features 173 may refer to a source or a drain, individually or collectively dependent upon the context. In some embodiments, the dielectric wall 16 has a middle portion 16M on which the two gate electrodes 21 are merged (see also FIG. 10) and two side portions 16S which are at two opposite sides of the middle portion 16M. Although not shown in figures, each of the side portions 16S is disposed to separate one of the source/drain features 173 of the first device unit 30A from a corresponding one of the source/drain features 173 of the second device unit 30B.

In each of the first and second device units 30A, 30B, as shown in FIG. 10, the channel features 121B are spaced apart from each other in the Z direction. The dielectric wall 16 includes the first part 161 which includes a plurality of first portions 16X that are respectively in direct contact with the channel features 121B of the first device unit 30A, and the second part 162 which includes a plurality of second portions 16Y that are in direct contact with the channel features 121B of the second device unit 30B. In some embodiments, the first portions 16X of the first part 161 form a continuous structure, and the second portions 16Y of the second part 162 form a continuous structure, as shown in FIG. 10.

In some embodiments, at least one of the first and second parts 161, 162 carries positive charges or negative charges. In some embodiments, by depositing a suitable dielectric material on a silicon-based semiconductor material, the positive or negative charges may be induced at least at an interface of the silicon-based semiconductor material and the dielectric material. In some other embodiments, the positive and/or negative charges may be introduced into the first and second dielectric materials for respectively forming the first and second parts 161, 162 so as to permit each of the first and the second parts 161, 162 to carry positive charges, negative charges, or neutral charges (e.g., an amount of positive charges is equivalent to an amount of negative charges).

In some embodiments, in order to allow the first portions 16X of the first part 161 (or the second portions 16Y of the second part 162) to carry the positive charges, (i) a silicon-based dielectric material, a lanthanum-based dielectric material, hafnium silicate, lanthanum-doped hafnium oxide, combinations thereof, or other suitable materials may serve as the first dielectric material (or the second dielectric material), and (ii) a silicon-based semiconductor material (for example, crystalline silicon) or other suitable materials may serve as a material for forming the channel layers 121 of the first stack 12A (or the channel layers 121 of the second stack 12B). The silicon-based dielectric material may include silicon oxide (e.g., $SiO_2$), silicon carbide nitride (e.g., SiCN), silicon nitride (e.g., SiN, $Si_3N_4$), or other suitable materials. The lanthanum-based dielectric material may include lanthanum oxide (e.g., $La_2O_3$), lanthanum aluminum oxide (e.g., $LaAlO_3$), or other suitable materials. Hafnium silicate may be hafnium (IV) silicate ($HfSiO_4$).

In some embodiments, in order to allow the first portions 16X of the first part 161 (or the second portions 16Y of the second part 162) to carry the negative charges, (i) an aluminum-based dielectric material or other suitable materials may serve as the first dielectric material (or the second dielectric material), and (ii) a silicon material (for example, crystalline silicon) or other suitable materials may serve as a material for forming the channel layers 121 of the first stack 12A (or the channel layers 121 of the second stack 12B). The aluminum-based dielectric material may include aluminum oxide, e.g., $Al_2O_3$ or $AlO_x$.

In some embodiments, one of the first and second parts 161, 162 carries positive charges or negative charge, and the other one of the first and second parts 161, 162 carries neutral charges. In order to allow the first portions 16X of the first part 161 (or the second portions 16Y of the second part 162) to carry the neutral charges, (i) undoped hafnium oxide (e.g., $HfO_2$) or other suitable materials may serve as the first dielectric material (or the second dielectric material), and (ii) a silicon material (for example, crystalline silicon) or other suitable materials may serve as a material for forming the channel layers 121 of the first stack 12A (or the channel layers 121 of the second stack 12B).

In some embodiments, when the first device unit 30A and the second device unit 30B are respectively configured as an n-type device and a p-type device, the first portions 16X of the first part 161 may carry the negative charges, and the second portions 16Y of the second part 162 may carry the positive charges. With such configuration, for the n-type first device unit 30A, the negative charges present in the first portions 16X of the first part 161 exert a repulsive force on electrons present in end portions of the channel features 121B of the first device unit 30A in a direction away from the dielectric wall 16, so as to ensure an electrical isolation between the end portions of the channel features 121B of the first device unit 30A and the first part 161, especially when the semiconductor structure 100 is switched off. Similarly, for the p-type second device unit 30B, the positive charges present in the second portions 16Y of the second part 162 exert a repulsive force on electron holes present in end portions of the channel features 121B of the second device unit 30B in a direction away from the dielectric wall 16, so as to ensure an electrical isolation between the end portions of the channel features 121B of the second device unit 30B and the second part 162. As such, a current leakage ($I_{off}$) may be significantly reduced, and each of the gate electrodes 21 can effectively take control over the channel features 121B of a corresponding one of the first and second device units 30A, 30B to prevent current leakage to the fins 11 and/or the substrate 10 through the dielectric wall 16, and to reduce short channel effect (SCE), such as improved drain induced barrier lowering (DIBL). In some embodiments, an amount of the positive or negative charges present in each of the first and second parts 161, 162 ranges from about $1 \times 10^{11}$ $C/cm^2$ to about $1 \times 10^{13}$ $C/cm^2$, so that the amount of the positive or negative charges is sufficient to provide the abovementioned beneficial effects. Apart from the benefit of enhanced gate control over the channel features 121B, the configuration of the dielectric wall 16 having first and second parts 161, 162 is also beneficial for providing greater feasibility of threshold voltage tuning. In some embodiments, the semiconductor structure of the present disclosure may have a target threshold voltage ($V_t$), and a feasible range of the threshold voltage may be from about $V_t$–20 mV to about $V_t$+20 mV. In some embodiments, by adjusting the amount of positive or negative charges present in the first and/or second parts 161, 162, the feasible range of the threshold voltage of the thus obtained semiconductor structure may be adjusted.

In some other embodiments, when the first device unit 30A and the second device unit 30B are respectively configured as an n-type device and a p-type device, the first portions 16X of the first part 161 may carry negative charges, and the second portions 16Y of the second part 162 may carry neutral charges.

In certain embodiments, when the first device unit 30A and the second device unit 30B are respectively configured as an n-type device and a p-type device, the first portions 16X of the first part 161 may carry neutral charges, and the second portions 16Y of the second part 162 may carry positive charges.

FIGS. 13 to 16 respectively illustrate semiconductor structures 200, 300, 400 and 500 in accordance with some embodiments, which are similar to the semiconductor structure 100 shown in FIG. 10.

Figure 13:
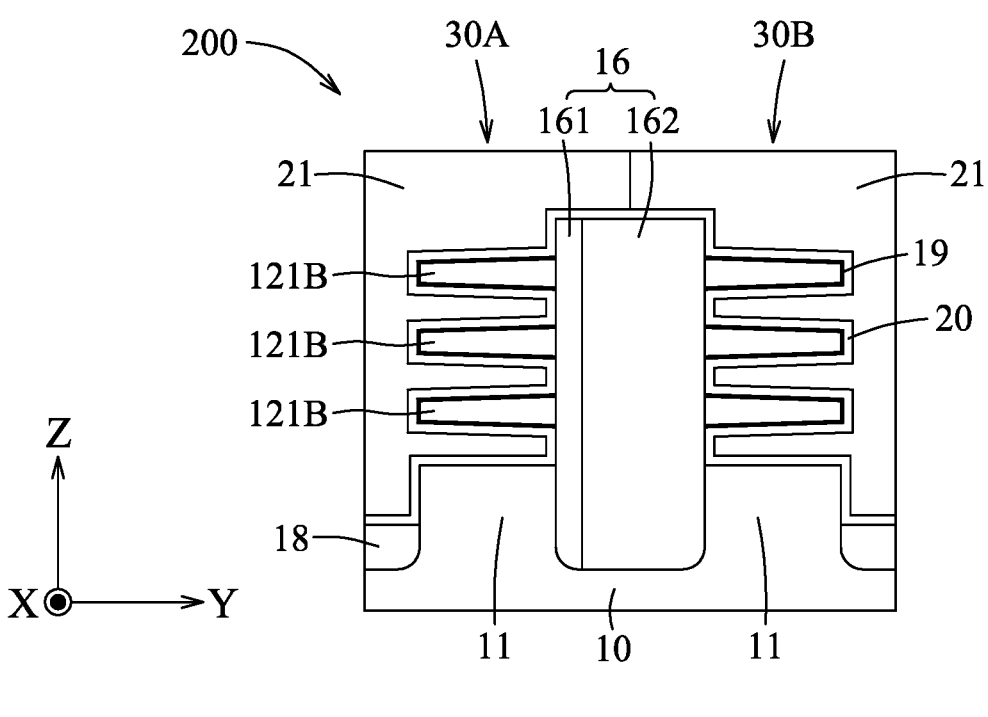

Referring to FIG. 13, the semiconductor structure 200 differs from the semiconductor structure 100 in that a shape of each of bottom portions of the first part 161 and the second part 162 of the dielectric wall 16. The semiconductor structure 200 could be achieved by adjusting working conditions regarding forming the first dielectric material layer 15 into the first part 161 with references to FIGS. 4 and 5, such that a horizontal portion of the first dielectric material layer 15 disposed on the substrate 10 is removed, leaving a vertical portion of the first dielectric material layer 15 disposed on the first stack 12A remains. The manufacturing process of the semiconductor structure 200 will be further discussed later.

Figure 14:
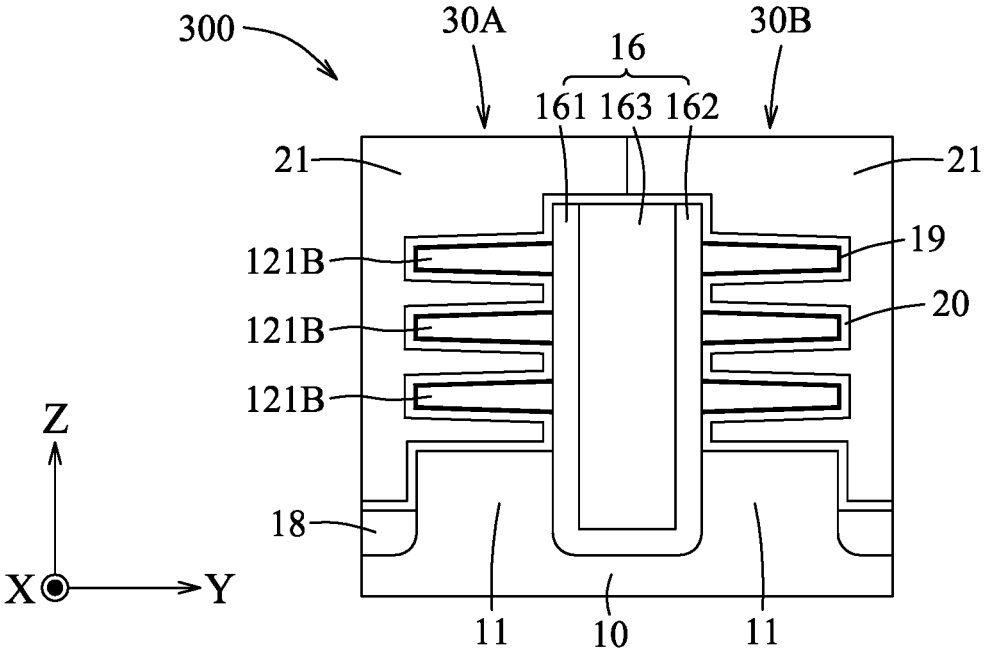

Referring to FIG. 14, the semiconductor structure 300 differs from the semiconductor structure 100 in that the dielectric wall 16 further includes a middle part 163 formed between the first and second parts 161, 162, and the first and second parts 161, 162 together form a U-shape cross section. In some embodiments, the first and second device units 30A, 30B may be the same type of device. In such case, the first and second parts 161, 162 of the semiconductor structure 300 are both made of the first dielectric material and are formed simultaneously. The middle part 163 is formed after forming the first and second parts 161, 162, and is made of the second dielectric material different from the first dielectric material. The first and second dielectric materials may independently be those described in step 102 with reference to FIG. 4, regarding to the material of the first dielectric material layer 15, such that the first and second part 161, 162 formed may carry a desired type of electrical charges (positive charges, negative charges, or neutral charges), and the middle part 163 may carry another desired type of electrical charges. In other embodiments, the first part 161, the second part 162, and the middle part 163 formed may carry the same type of electrical charges, but amount of electrical charges present in the middle part 163 may be different from that of the first and second parts 161, 162. The manufacturing process of the semiconductor structure 300 will be further discussed later.

Figure 15:
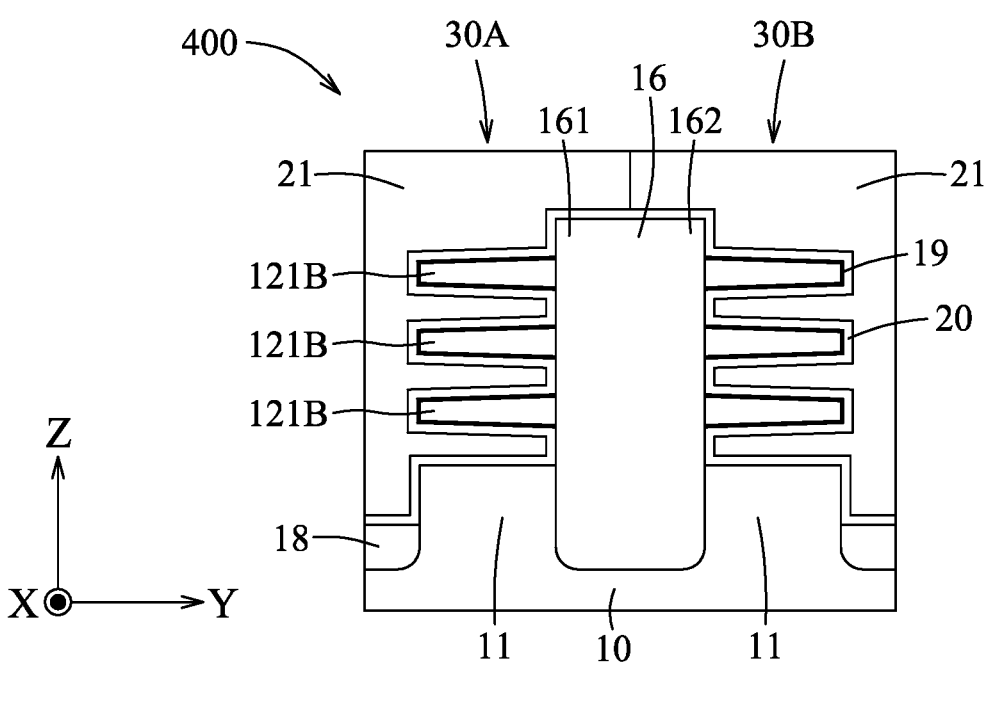

Referring to FIG. 15, the semiconductor structure 400 differs from the semiconductor structure 100 in that both the first part 161 and the second part 162 of the dielectric wall 16 are made of the first dielectric material, and are formed simultaneously. The first dielectric material may be those described in step 102 with reference to FIG. 4, regarding to the material of the first dielectric material layer 15, such that the first and second part 161, 162 formed may carry a desired type of electrical charges (positive charges, negative charges, or neutral charges). The manufacturing process of the semiconductor structure 300 will be further discussed later.

Figure 16:
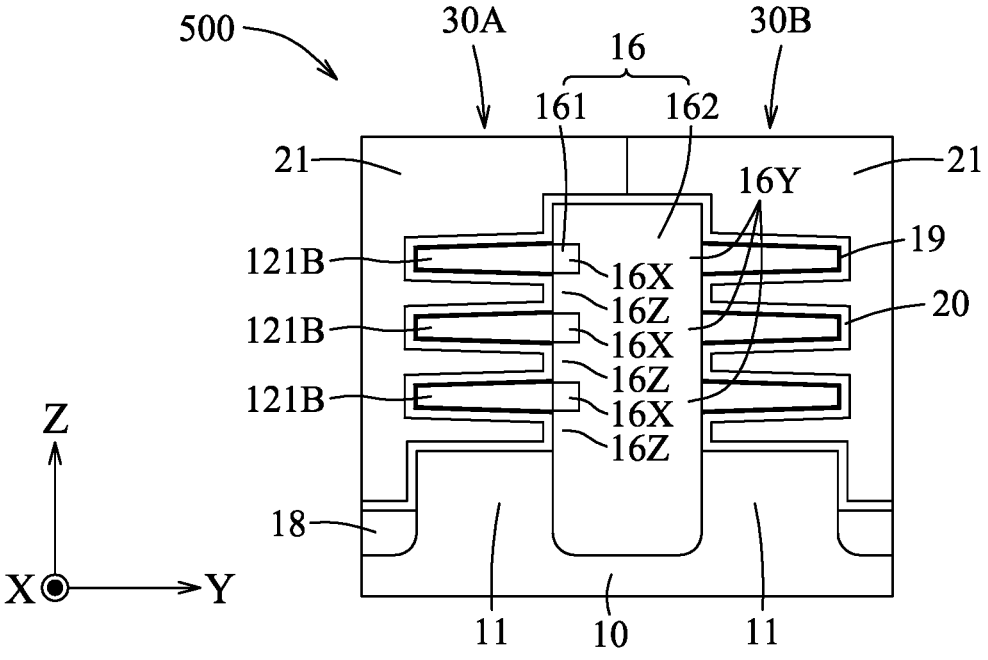

Referring to FIG. 16, the semiconductor structure 500 differs from the semiconductor structure 100 in that the first part 161 includes a plurality of first portions 16X that are in contact with the channel features 121B of the first device unit 30A, and that are separated from each other, i.e., the first portions 16X form a discontinuous structure, and the second part 162 includes a plurality of second portions 16Y that are in direct contact with the channel features 121B of the second device unit 30B. In some embodiments, the second part 162 further includes a plurality of third portions 16Z that alternate with the first portions 16X of the first part 161. The first part 161 is made of the first dielectric material and the second part 162 is made of the second dielectric material different from the first dielectric material. The first and second dielectric materials may independently be those described in step 102 with reference to FIG. 4, regarding to the material of the first dielectric material layer 15, such that at least one of the first and second part 161, 162 formed may carry positive or negative charges.

The above description discusses single semiconductor structure. In some embodiments, a semiconductor assembly of the present disclosure includes two or more the above-mentioned semiconductor structures 100, 200, 300, 400, 500, or combinations thereof.

Figure 21:
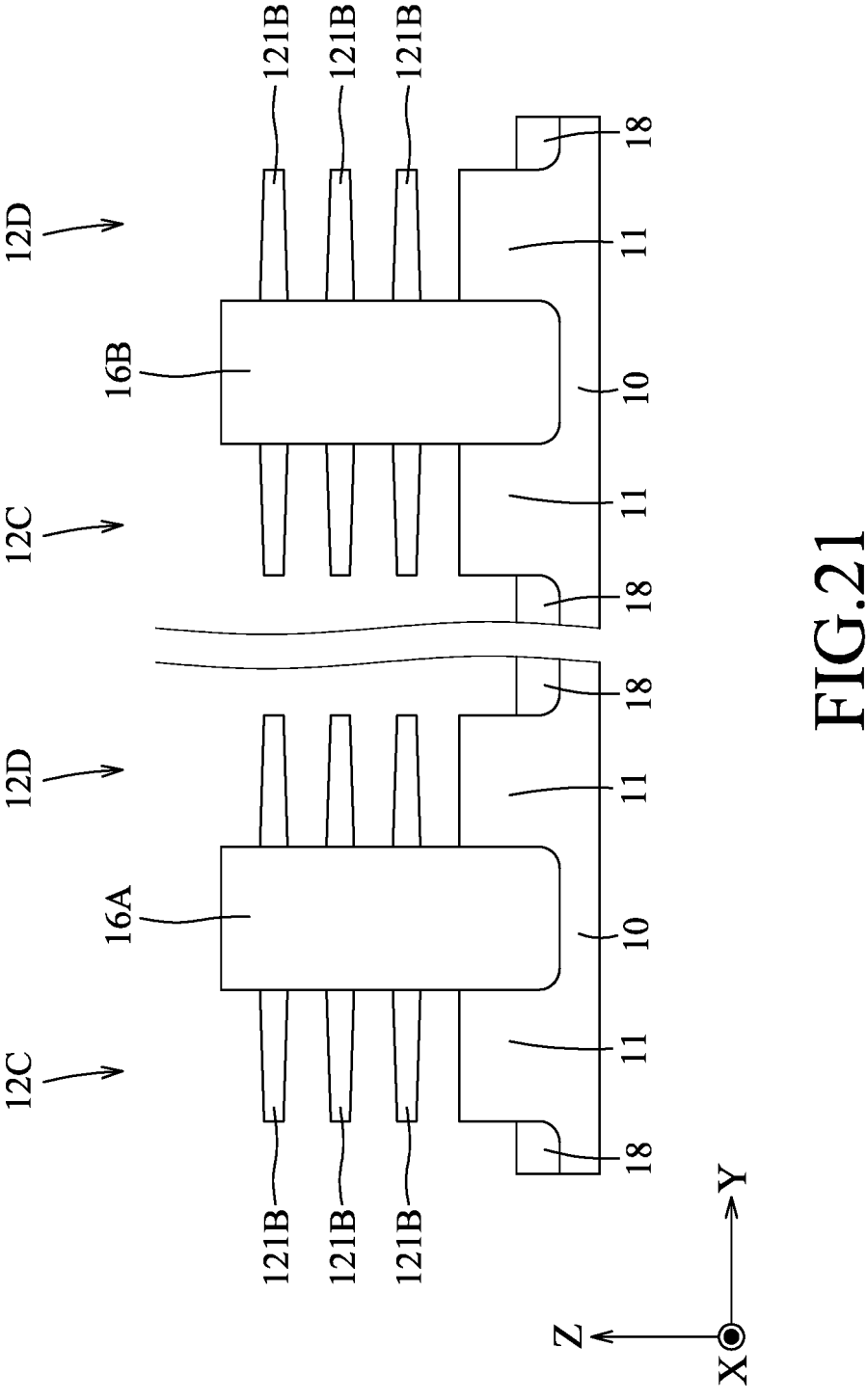
Figure 22:
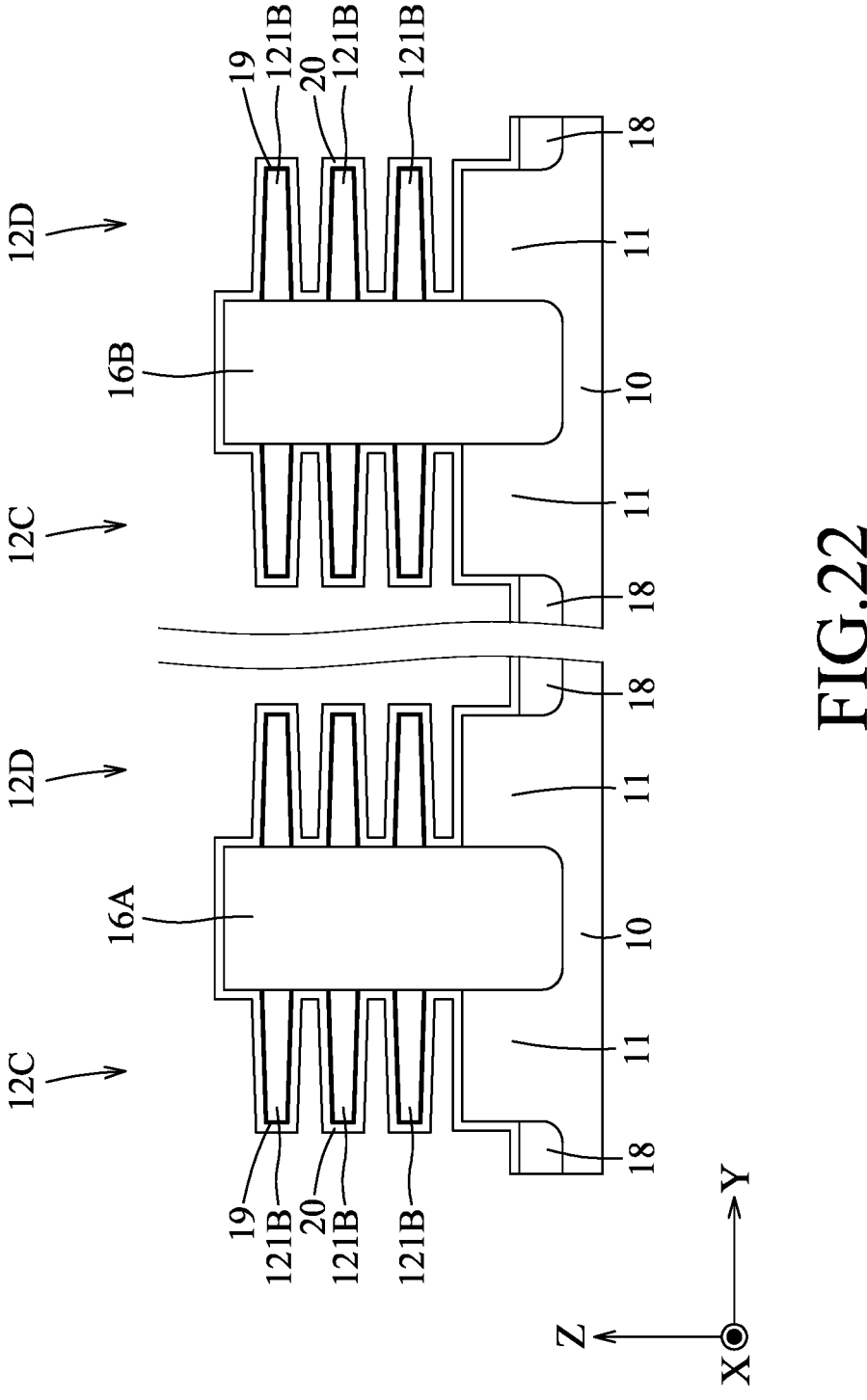
Figure 23:
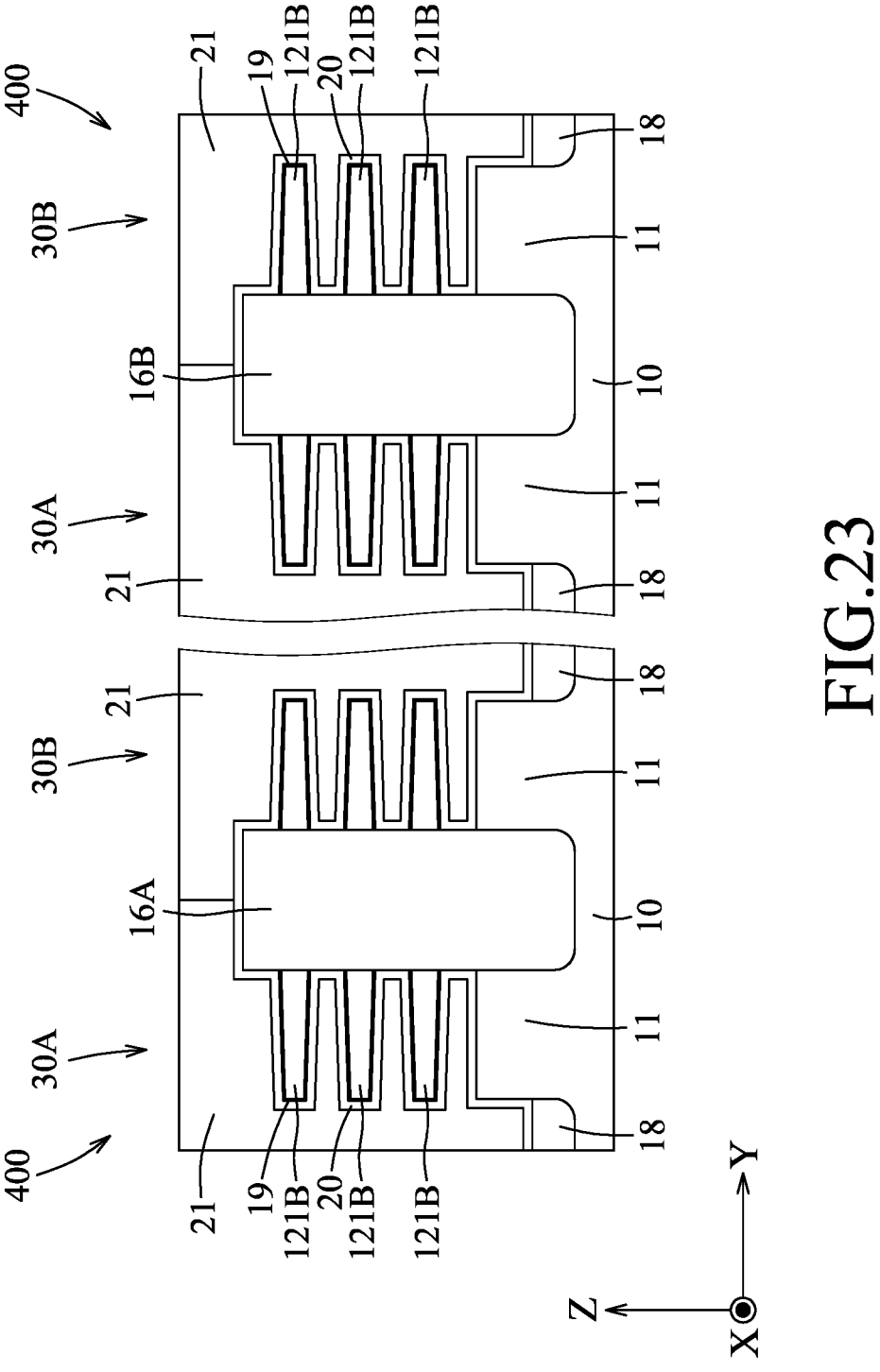

FIGS. 17 to 23 describe a method for manufacturing the semiconductor assembly including two semiconductor structures 400 as shown in FIG. 23.

Figure 17:
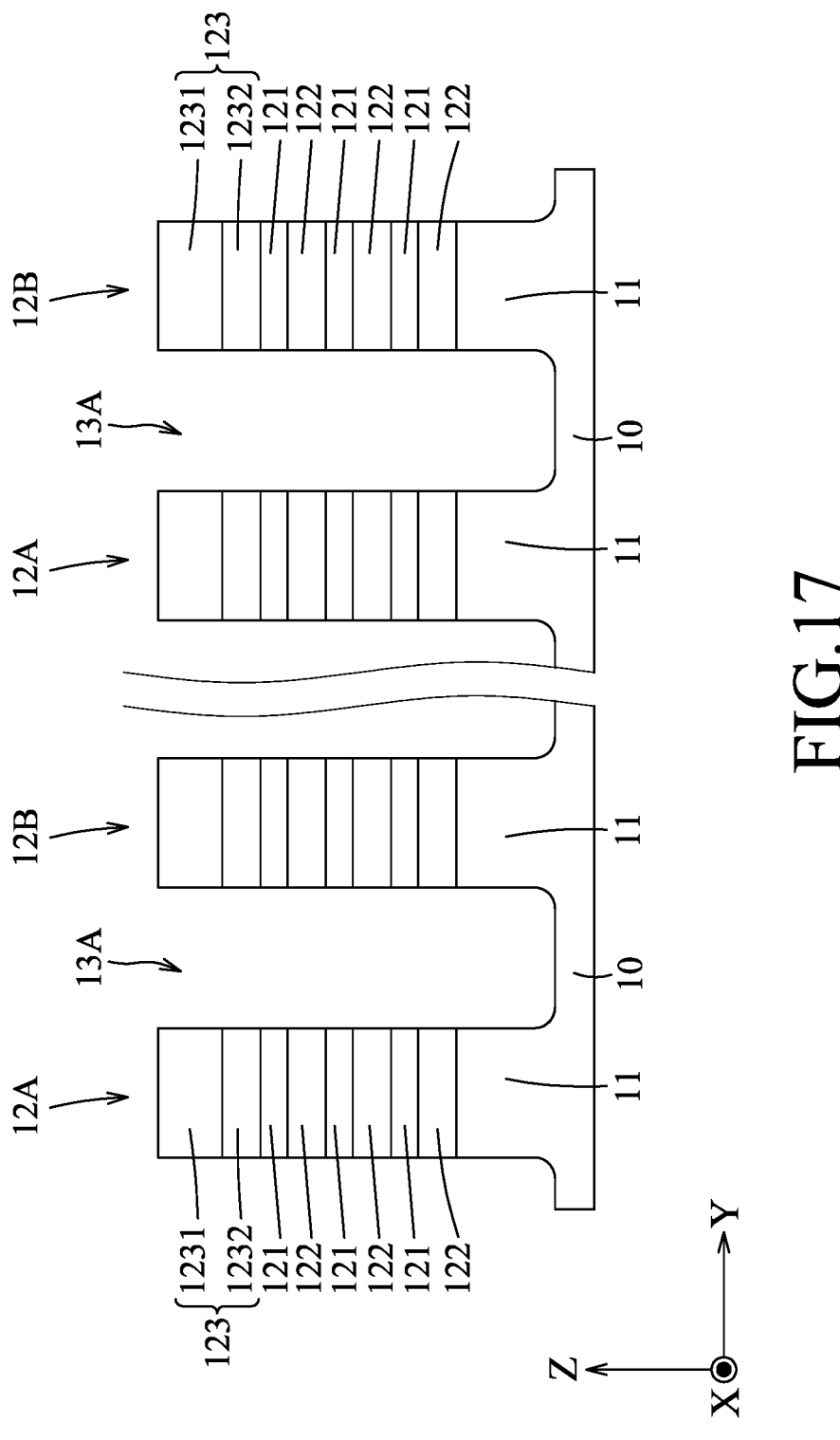
FIGS. 17 to 33 are schematic views illustrating intermediate stages of a method for manufacturing a semiconductor assembly in accordance with some embodiments.

Referring to FIG. 17, two patterned structures, each of which is illustrated with reference to FIG. 2 are prepared. Details thereof are omitted for the sake of brevity.

Figure 18:
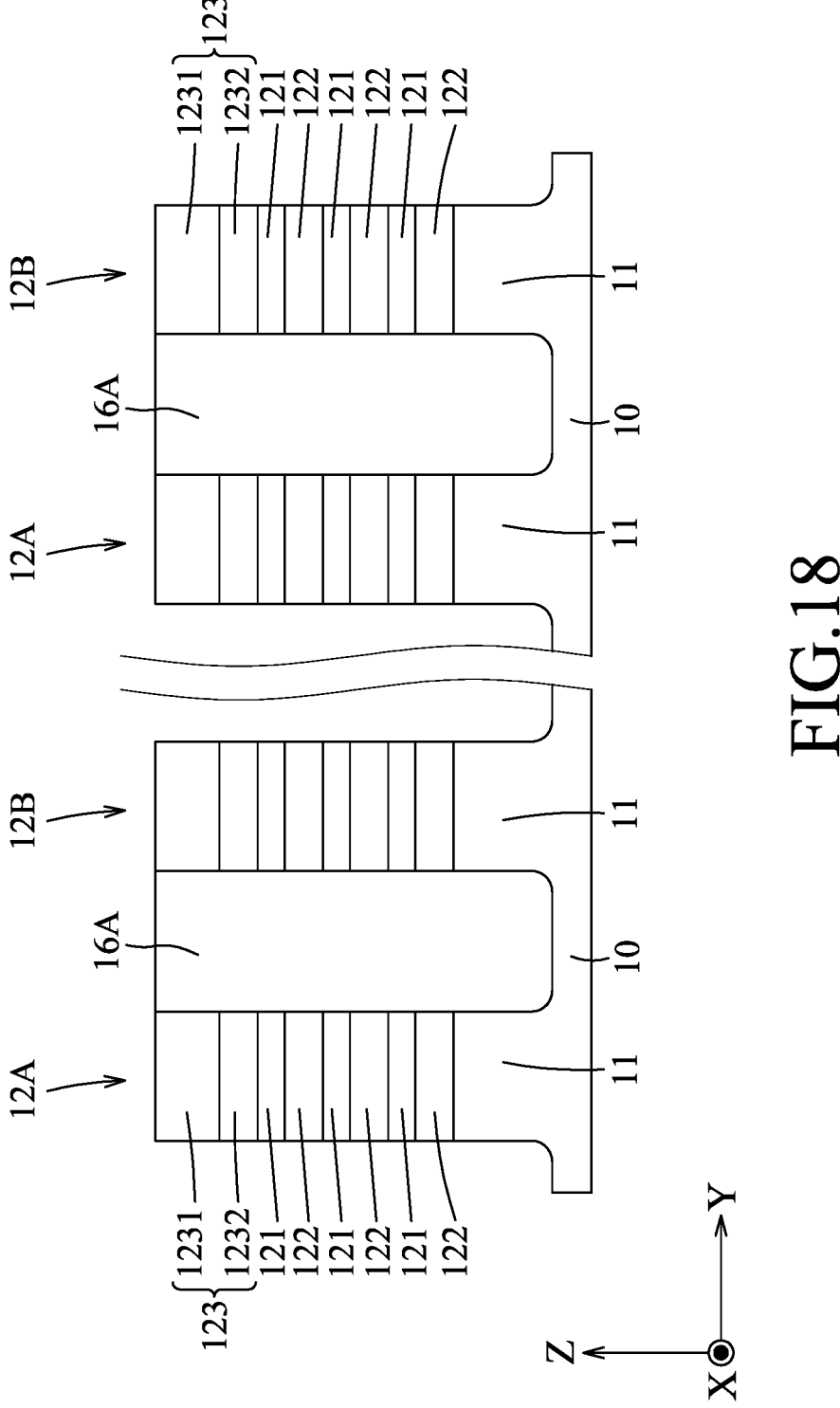

Referring to FIG. 18, the first dielectric material, which is to form the dielectric wall (denoted as 16A) of the left semiconductor structure of the semiconductor assembly shown in FIG. 23, is deposited in the first gap 13A (see FIG. 17) of each of the left and right patterned structures using CVD, ALD or other suitable techniques, followed by a planarization process such as CMP or other suitable techniques to remove excess first dielectric material.

Figure 19:
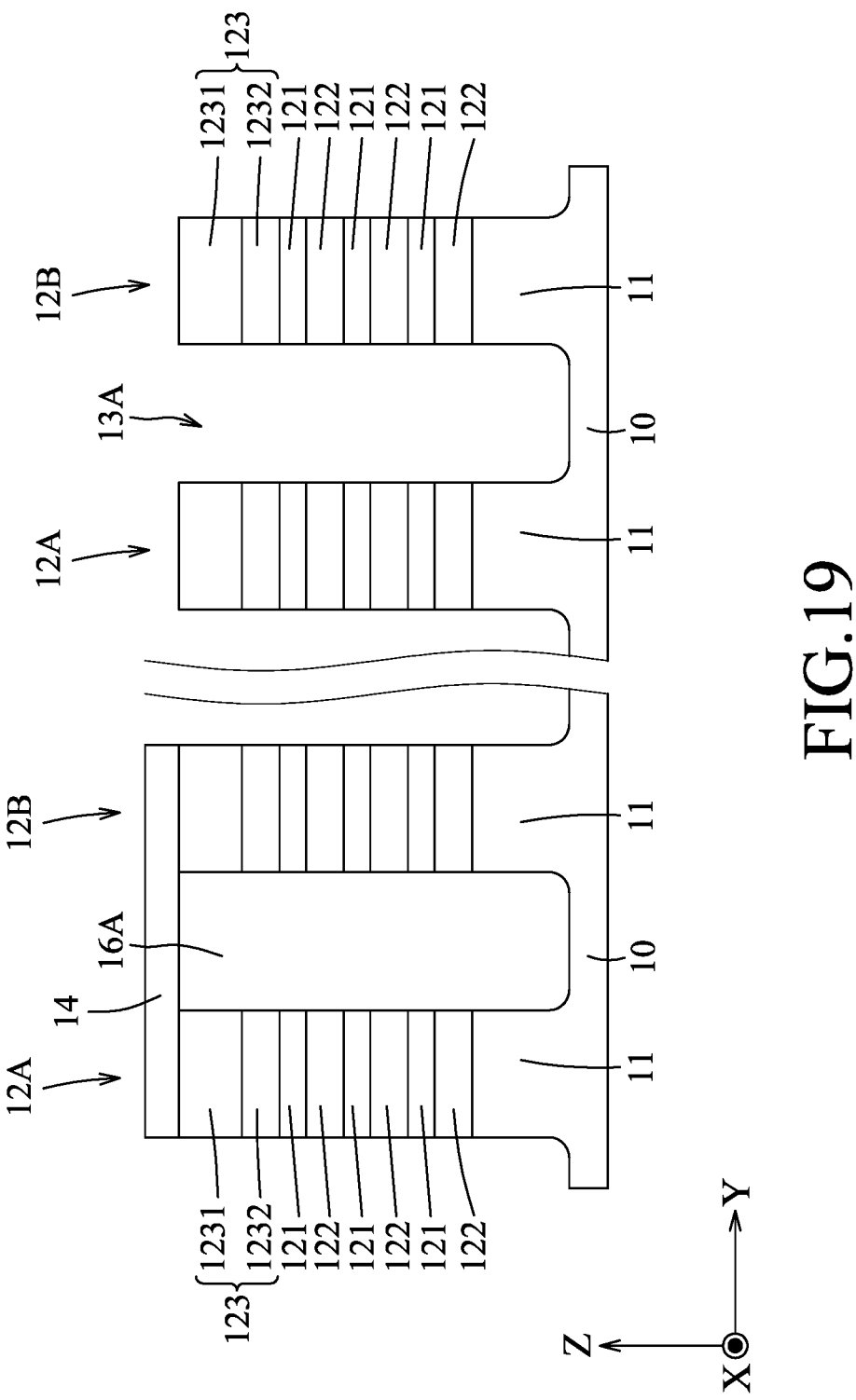

Referring to FIG. 19, the masking material layer 14 described in step 102 with reference to FIG. 4 is formed over the left patterned structure and the dielectric wall 16A of the left patterned structure. Materials and formation of the masking material layer 14 are similar to those described in step 102 with reference to FIG. 4 and thus are omitted for the sake of brevity. In addition, the first dielectric material filled in the first gap 13A of the right patterned structure is removed using etching or other suitable techniques, such that for the right patterned structure, the channel layers 121 of each of the first and second stacks 12A, 12B are exposed through the first gap 13A.

Figure 20:
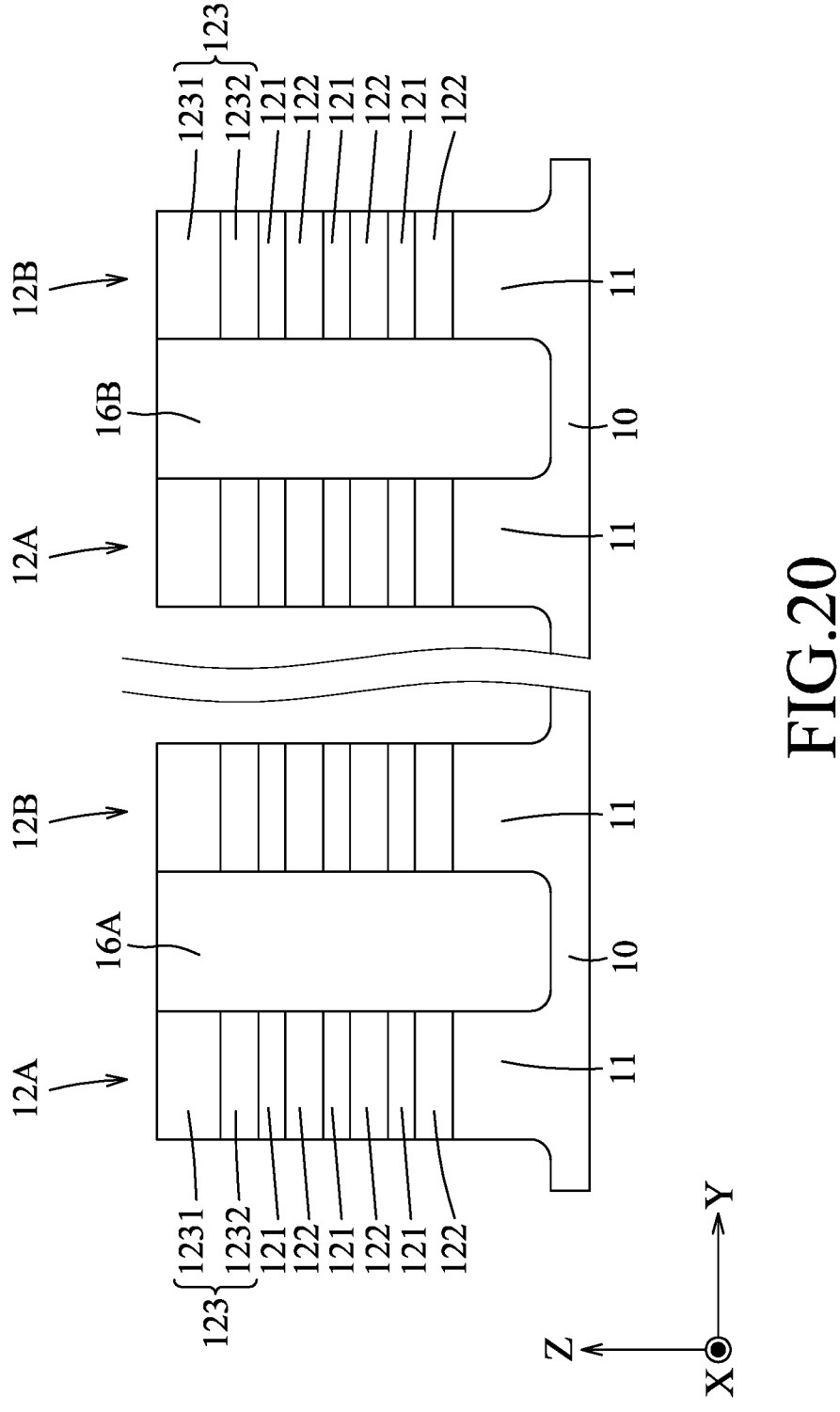

Referring to FIG. 20, the second dielectric material, which is to form the dielectric wall (denoted as 16B) of the right semiconductor structure of the semiconductor assembly shown in FIG. 23, is deposited in the first gap 13A of the right patterned structure using CVD, ALD or other suitable techniques, followed by a planarization process such as CMP or other suitable techniques to remove excess second dielectric material. As such, the dielectric wall 16A made of the first dielectric material and the dielectric wall 16B made of the second dielectric material are formed. The first and second dielectric materials may be different from each other and may independently be those described in step 102 with reference to FIG. 4, regarding to the material of the first dielectric material layer 15, such that at least one of the dielectric walls 16A, 16B formed may carry positive or negative charges. For example, in certain embodiments, the first and second device units 30A, 30B of the left semiconductor structure 400 shown in FIG. 23 are each configured as an n-type device, the dielectric wall 16A carries negative charges, and the first and second device units 30A, 30B of the right semiconductor structure 400 shown in FIG. 23 are each configured as a p-type device, the dielectric wall 16B carries positive charges. In some embodiments, one of the dielectric wall 16A or the dielectric wall 16B may carry neutral charges.

Referring to FIGS. 21 to 22, the subsequent steps of forming the structures shown in FIG. 20 into the structures shown in FIG. 22 are similar to steps 105 to 107 with reference to FIGS. 7 to 9, and thus the details thereof are omitted for the sake of brevity.

Referring to FIG. 23, two gate electrodes 21 are respectively formed around the channel features 121B for each of the left and right structures shown in FIG. 22, thereby obtaining the semiconductor assembly including two semiconductor structures 400. In some embodiments, when the first and second device units 30A, 30B of the left semiconductor structure 400 are each configured as a first type device (for example, an n-type device) and the first and second device units 30A, 30B of the right semiconductor structure 400 are each configured as a second type device different from the first type device (for example, a p-type device), the gate electrodes 21 on the left semiconductor structure 400 may be made of a material different from that of the gate electrodes 21 on the right semiconductor structure 400. The materials and formation of the gate electrodes 21 are similar to step 108 with reference to FIG. 10, and thus the details thereof are omitted for the sake of brevity.

Figure 26:
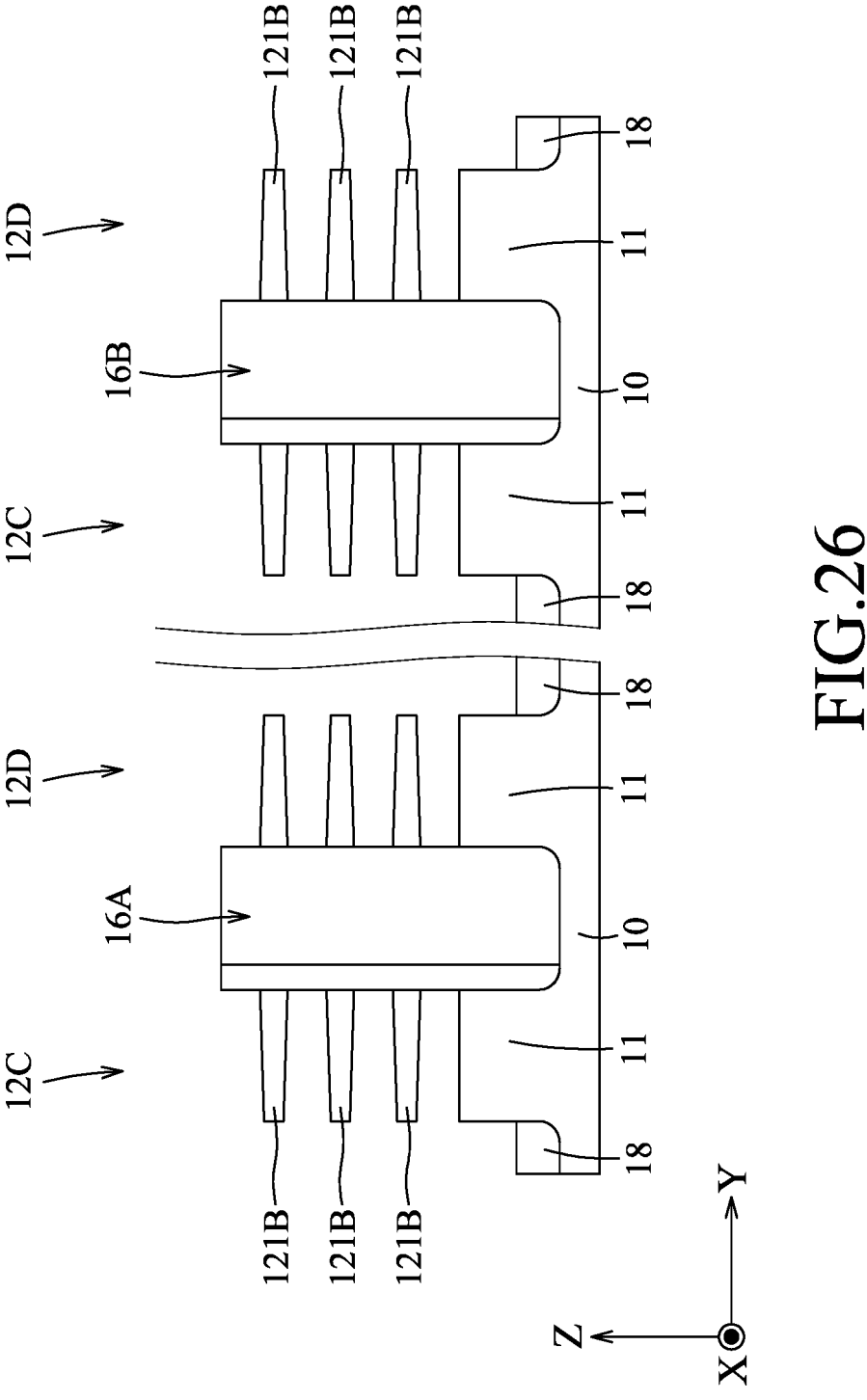
Figure 27:
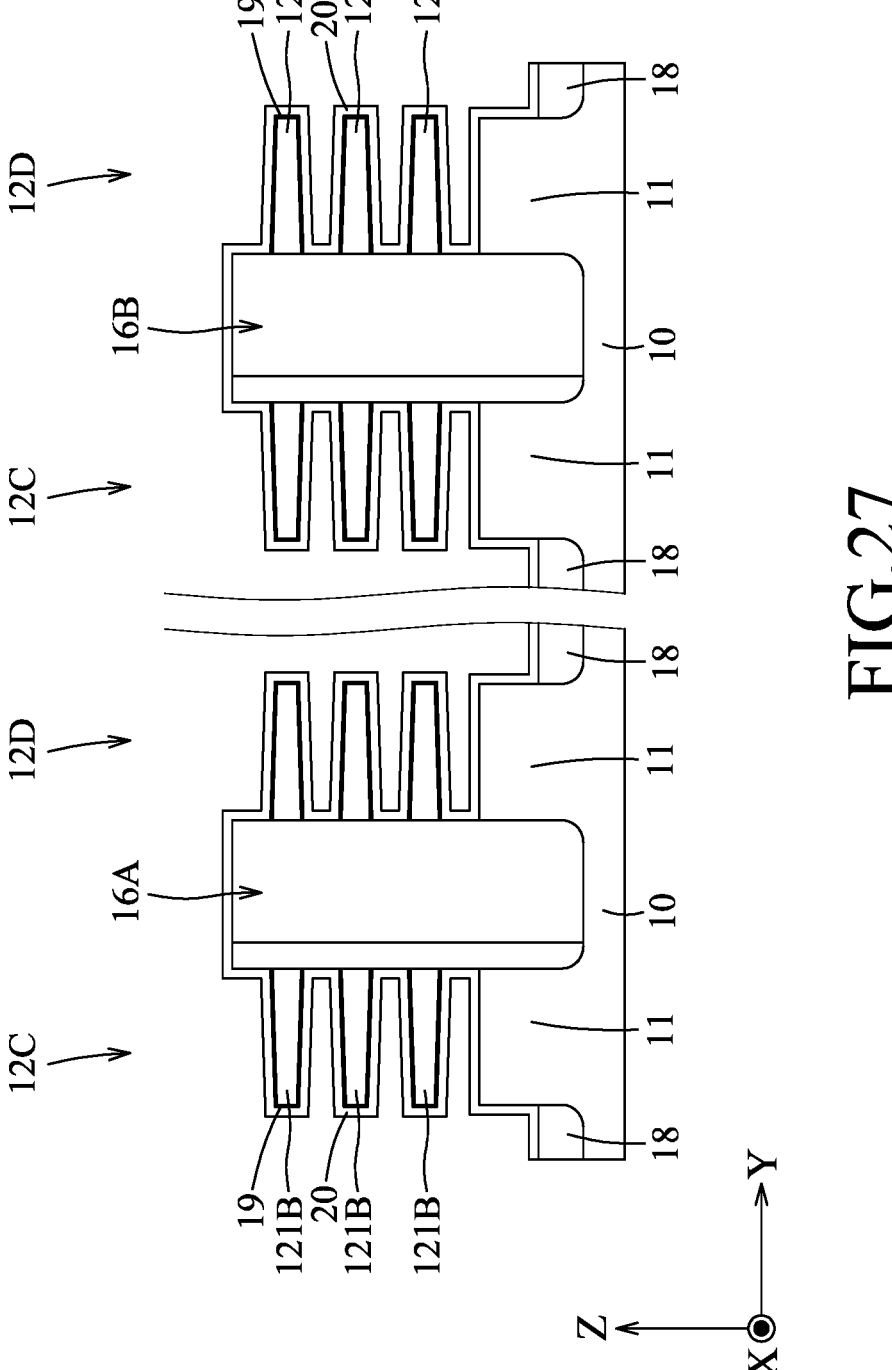
Figure 28:
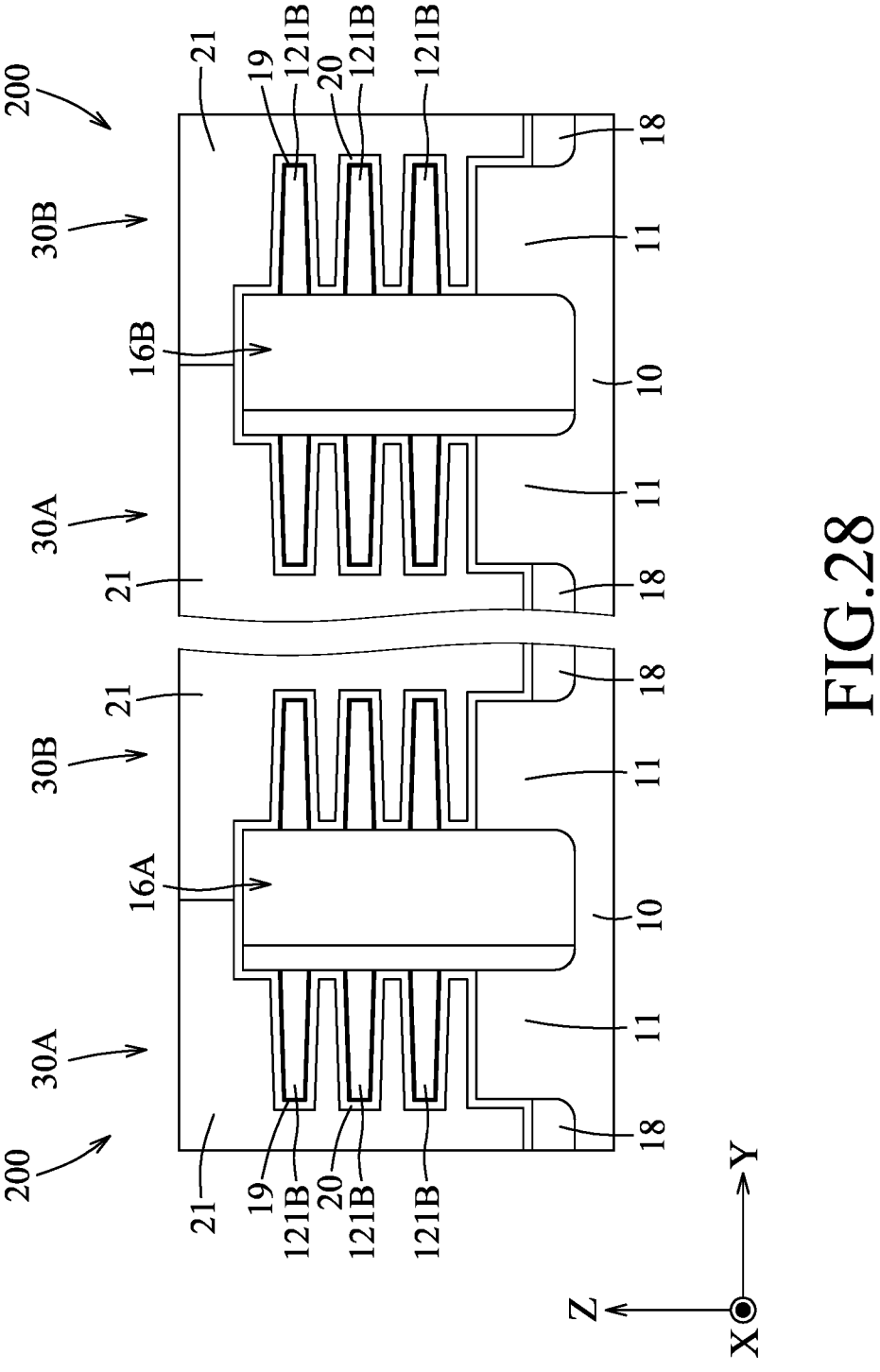

FIGS. 24 to 28 describe a method for manufacturing the semiconductor assembly including two semiconductor structures 200 as shown in FIG. 28

Figure 24:
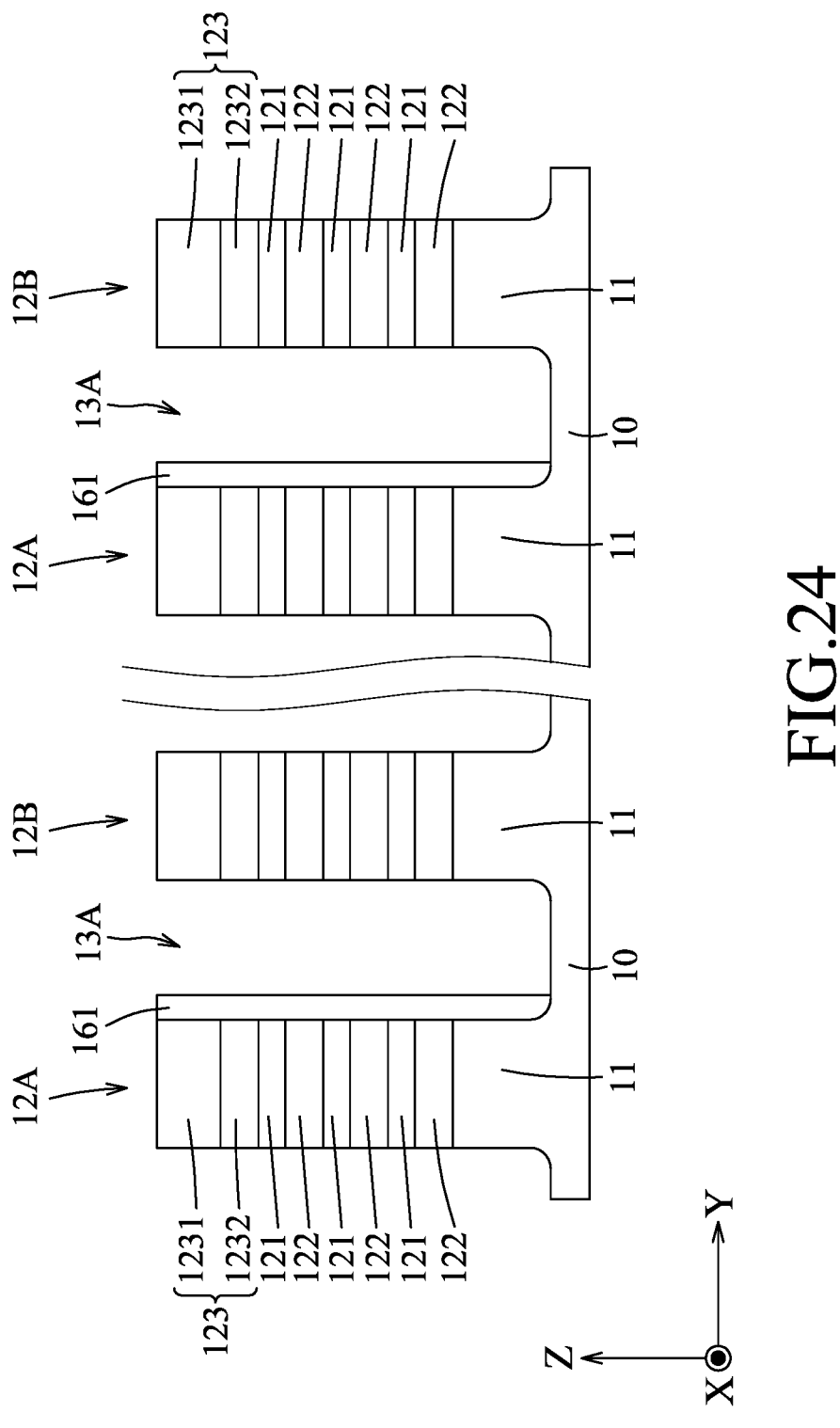

Referring to FIG. 24, for each of the left and right patterned structures shown, the first part 161 is formed to be in contact with the channel layers 121 of the first stack 12A of each of the left and right patterned structure. Materials and formation of the first part 161 are similar to those described in steps 102 to 103 with reference to FIGS. 4 and 5, except that working conditions may be adjusted so that for each of the left and right patterned structures, portions of the first dielectric material layer 15 shown in FIG. 4 (which are other than a vertical portion of the first dielectric material layer 15 disposed on the first stack 12A and in the first gap 13A) are removed so as to form the first part 161 as shown in FIG. 24. Details regarding materials and formation of the first part 161 are omitted for the sake of brevity.

Figure 25:
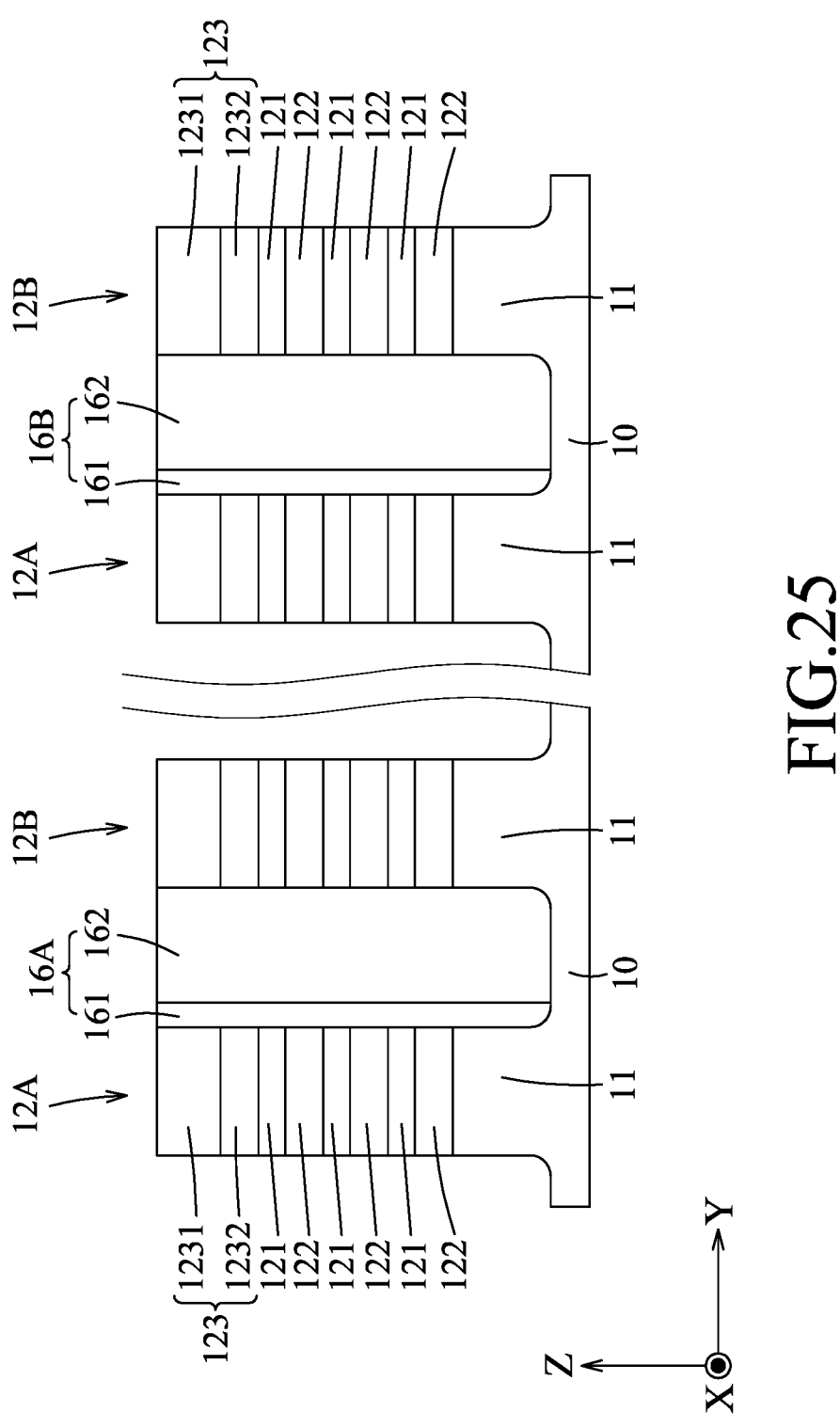

Referring to FIG. 25, for each of the left and right patterned structures shown, the second part 162 is formed in the first gap 13A shown in FIG. 24. Materials and formation of the second parts 162 are similar to those described in step 104 with reference to FIG. 6, and details thereof are omitted for the sake of brevity. The first part 161 and the second part 162 of the left structure form the dielectric wall 16A, while the first part 161 and the second part 162 of the right structure form the dielectric wall 16B. The first parts 161 of the left and right structures are each made of the first dielectric material. The second parts 162 of the left and right structures are each made of the second dielectric material different from the first dielectric material. In some embodiments, the first parts 161 carry positive charges and the second parts 162 carry negative charges (or alternatively, the first parts 161 carry negative charges and the second parts 162 carry positive charges). In some other embodiments, the first parts 161 carry positive charges and the second parts 162 carry neutral charges (or alternatively, the first parts 161 carry negative charges and the second parts 162 carry neutral charges). In certain embodiments, the first parts 161 carry neutral charges and the second parts 162 carry negative charges (or alternatively, the first parts 161 carry neutral charges and the second parts 162 carry negative charges).

Referring to FIGS. 26 to 28, the subsequent steps of forming the structures shown in FIG. 25 into the structures shown in FIG. 28 are similar to steps 105 to 108 with reference to FIGS. 7 to 10, and the details thereof are omitted for the sake of brevity.

Figure 31:
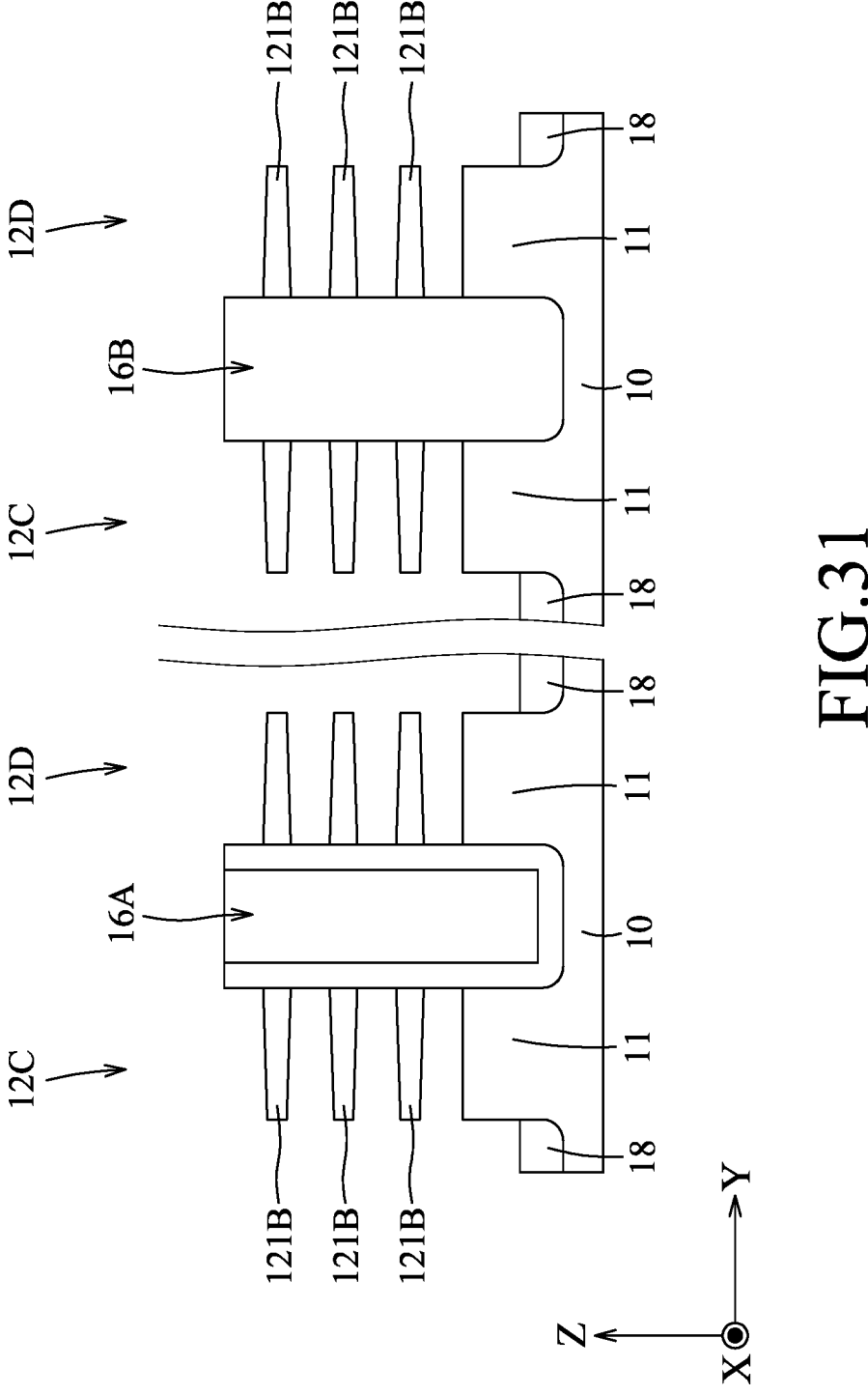
Figure 32:
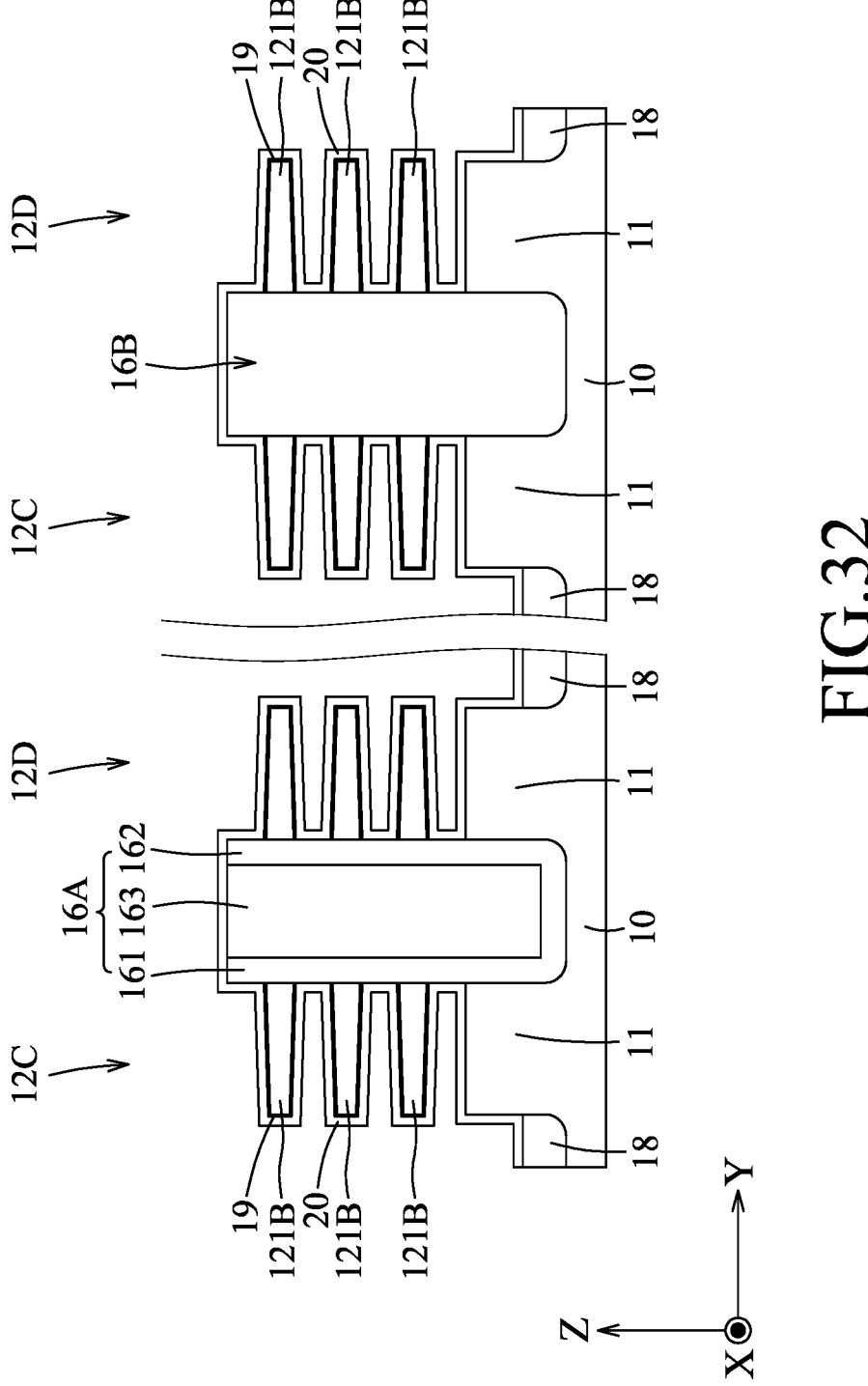
Figure 33:
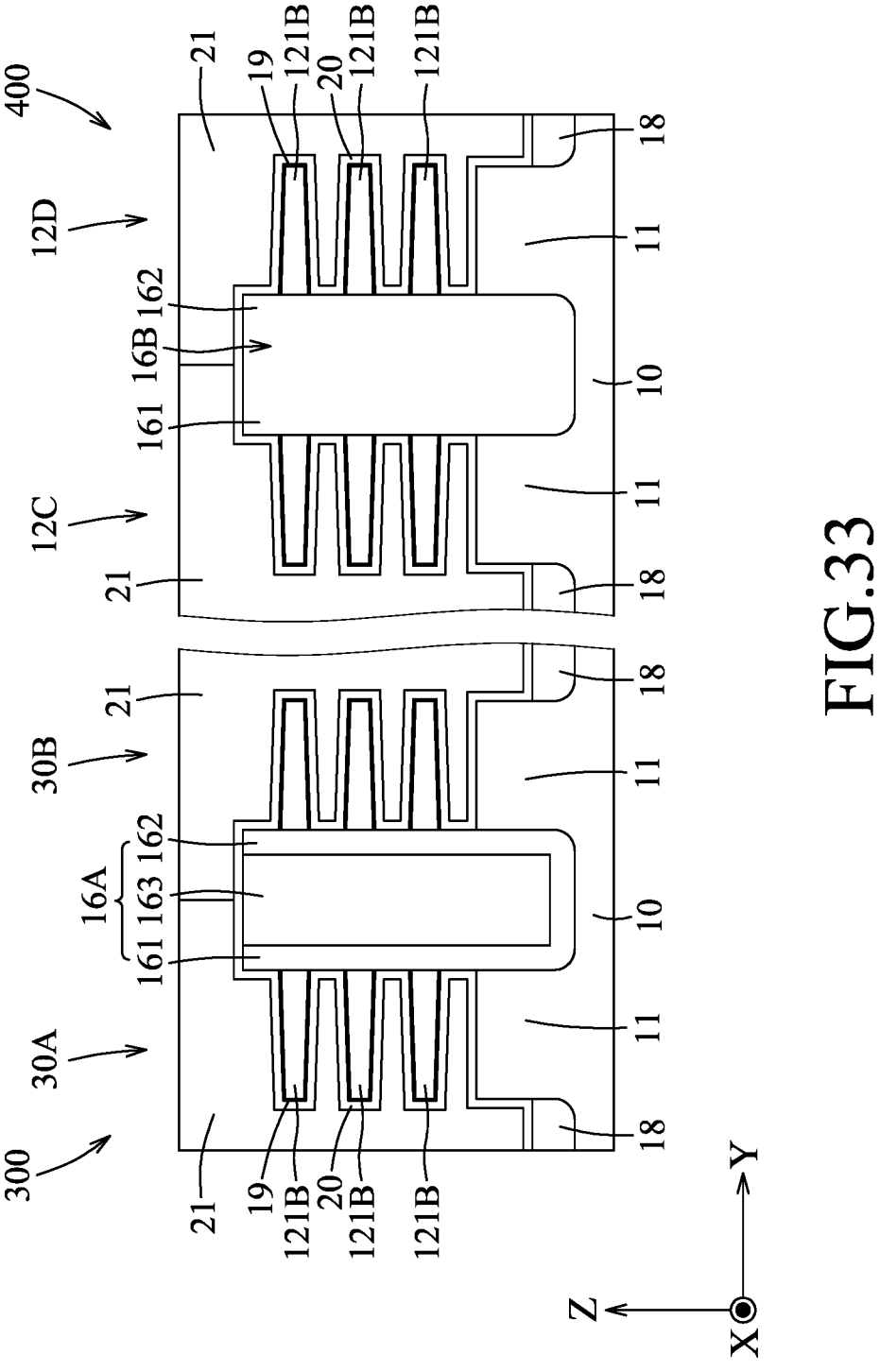

FIGS. 29 to 33 describe a method for manufacturing the semiconductor assembly including one semiconductor structure 300 and one semiconductor structure 400 as shown in FIG. 33.

Figure 29:
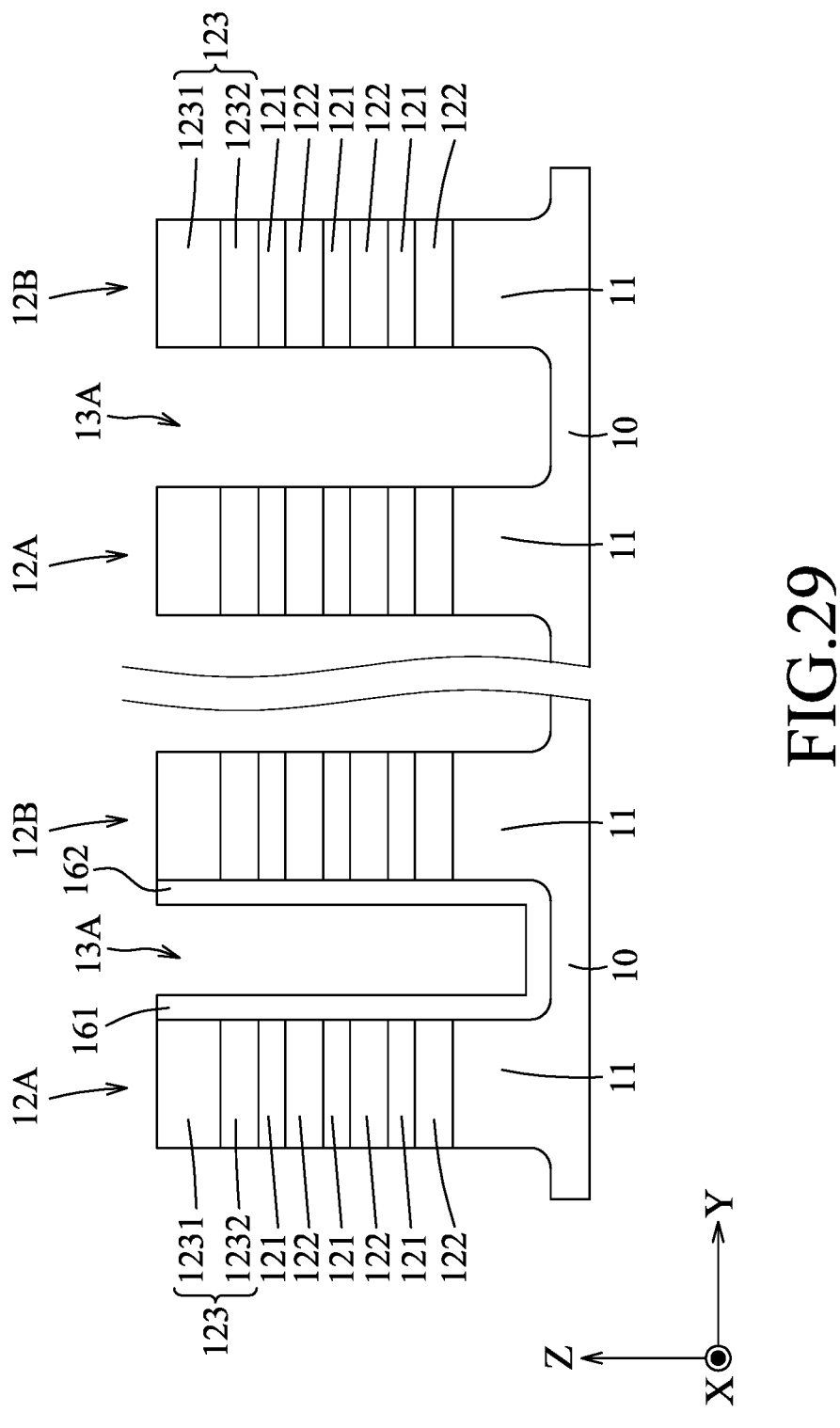

Referring to FIG. 29, the first part 161 and the second part 162 are formed in the first gap 13A of the left patterned structure. This could be obtained by sub-steps of (i) forming the first dielectric material layer (not shown, which may be similar to the first dielectric material layer 15 shown in FIG. 4) made of the first dielectric material over the two patterned structures; (ii) forming the masking material layer (not shown, which may be similar to the masking material layer 14 shown in FIG. 19) to cover the first dielectric material layer over the first gap 13A of the left patterned structure; and (iii) removing a portion of the first dielectric material that is formed over the right patterned structure, thereby obtaining the first and second parts 161, 162 that together form a U-shape cross section in the left patterned structure, while the first and second stacks 12A, 12B of the right patterned structure are exposed through the first gap 13A. Sub-steps (i) and (ii) are similar to step 102 described with reference to FIG. 4, and sub-step (iii) is similar to step 103 described with reference to FIG. 5, and thus materials and details thereof are omitted for the sake of brevity.

Figure 30:
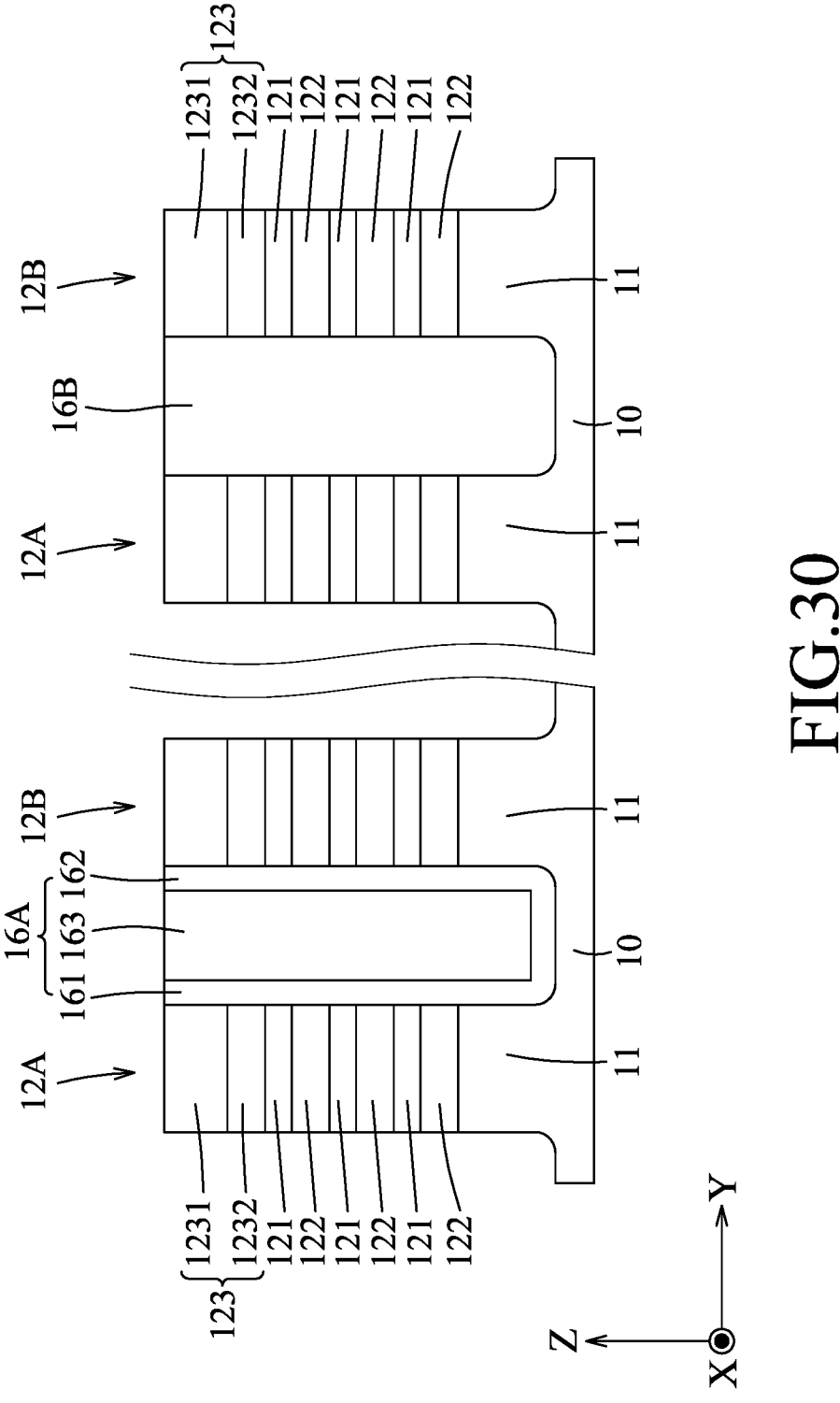

Referring to FIG. 30, the second dielectric material different from the first dielectric material is filled in the first gap 13A of each of the left and right patterned structures simultaneously (see also FIG. 29), and excessive second dielectric material is removed to thereby obtaining the dielectric wall 16B of the right patterned structure, and the middle part 163 of the dielectric wall 16A of the left patterned structure. Materials of the middle part 163 and the dielectric wall 16B are similar to those described in step 104 with reference to FIG. 6, and details thereof are omitted for the sake of brevity.

Referring to FIGS. 31 to 33, the subsequent steps of forming the structures shown in FIG. 30 into the structures shown in FIG. 33 are similar to steps 105 to 108 with reference to FIGS. 7 to 10, and the details thereof are omitted for the sake of brevity.

Referring to FIG. 33, the first part 161 and the second part 162 of the dielectric wall 16A of the semiconductor structure 300 are made of the first dielectric material and are formed simultaneously, while the middle part 163 of the dielectric wall 16A of the semiconductor structure 300 and the dielectric wall 16B of the semiconductor structure 400 are made of the second dielectric material and are formed simultaneously. In some embodiments, the first and second dielectric materials may be different from each other in terms of the corresponding conductivity type of the device units, or in terms of different amount of electrical charges present therein. In some embodiments, the first and second parts 161, 162 of the semiconductor structure 300 carry positive charges and the first and second parts 161, 162 of the semiconductor structure 400 carry negative charges (or alternatively, the first and second parts 161, 162 of the semiconductor structure 300 carry negative charges and the first and second parts 161, 162 of the semiconductor structure 400 carry positive charges). In some other embodiments, the first and second parts 161, 162 of the semiconductor structure 300 carry positive charges and the first and second parts 161, 162 of the semiconductor structure 400 carry neutral charges (or alternatively, the first and second parts 161, 162 of the semiconductor structure 300 carry negative charges and the first and second parts 161, 162 of the semiconductor structure 400 carry neutral charges). In certain embodiments, the first and second parts 161, 162 of the semiconductor structure 300 carry neutral charges and the first and second parts 161, 162 of the semiconductor structure 400 carry negative charges (or alternatively, the first and second parts 161, 162 of the semiconductor structure 300 carry neutral charges and the first and second parts 161, 162 of the semiconductor structure 400 carry positive charges).

The embodiments of the present disclosure have the following advantageous features. By virtue of including the dielectric wall formed with different parts (e.g., the first part and the second part, at least one of which carries positive or negative charges corresponding to a conductivity type of a corresponding one of the first and second device units), electrons or electron holes within the channel features of the corresponding device unit, by charge repulsion effect, are forced away from the dielectric wall. As such, current leakage could be greatly reduced, resulting in improved gate control of the end portion of the corresponding channel features, and reduced short channel effect (SCE), such as improved drain induced barrier lowering (DIBL). In addition, the configuration of the dielectric wall allows the semiconductor structure of the present disclosure to have greater feasibility of threshold voltage tuning.

In accordance with some embodiments of the present disclosure, a semiconductor structure includes: a first device unit and a second device unit, each of which includes channel features spaced apart from each other; and a dielectric wall disposed between the first and second device units. The dielectric wall includes a first part and a second part. The first part includes a plurality of first portions that are in direct contact with the channel features of the first device unit. The second part includes a plurality of second portions that are in direct contact with the channel features of the second device unit. At least one of the first and second parts carries positive or negative charges.

In accordance with some embodiments of the present disclosure, when the first device unit is an n-type device, the first part of the dielectric wall carries the negative charges.

In accordance with some embodiments of the present disclosure, the first part of the dielectric wall is made of an aluminum-based dielectric material.

In accordance with some embodiments of the present disclosure, when the second device unit is a p-type device, the second part of the dielectric wall carries the positive charges.

In accordance with some embodiments of the present disclosure, the second part of the dielectric wall is made of a silicon-based dielectric material, a lanthanum-based dielectric material, hafnium silicate, lanthanum-doped hafnium oxide, or combinations thereof.

In accordance with some embodiments of the present disclosure, an amount of the positive or negative charges present in the at least one of the first and second parts of the dielectric wall ranges from $1 \times 10^{11}$ C/cm$^2$ to $1 \times 10^{13}$ C/cm$^2$.

In accordance with some embodiments of the present disclosure, the first and second parts of the dielectric wall are made of different materials.

In accordance with some embodiments of the present disclosure, a semiconductor assembly includes two semiconductor structures. Each of the semiconductor structures includes a first device unit and a second device unit. Each of the first and second device units includes channel features, a gate electrode, a gate dielectric and a dielectric wall. The channel features are spaced apart from each other, and each of the channel features has an end portion. The gate electrode extends around the channel features. The dielectric wall is disposed between the first and second device units and includes a first part and a second part. The first part has a plurality of first portions that are respectively in direct contact with the end portions of the channel features of the first device unit. The second part has a plurality of second portions that are respectively in direct contact with the end portions of the channel features of the second device unit. In at least one of the semiconductor structures, at least one of the first and second parts includes a material that corresponds to a conductivity type of a corresponding one of the first and second device units.

In accordance with some embodiments of the present disclosure, the first and second device units of one of the semiconductor structures are each an n-type device, while the first and second device units of the other one of the semiconductor structures are each a p-type device. The dielectric wall of the one of the semiconductor structures includes a material different from that of the dielectric wall of the other one of the semiconductor structures.

In accordance with some embodiments of the present disclosure, the first part and the second part of the dielectric wall of one of the semiconductor structures together form a U-shape cross-section.

In accordance with some embodiments of the present disclosure, the first part and the second part of the dielectric wall of one of the semiconductor structures are made of a first dielectric material. The dielectric wall of the one of the semiconductor structures further includes a middle part which is disposed between the first and second parts, and which is made of a second dielectric material different from the first dielectric material. The dielectric wall of the other one of the semiconductor structures is made of the second dielectric material.

In accordance with some embodiments of the present disclosure, the first parts of the dielectric walls of the semiconductor structures are made of a first dielectric material; and the second parts of the dielectric walls of the semiconductor structures are made of a second dielectric material different from the first dielectric material.

In accordance with some embodiments of the present disclosure, each of the channel features is made of a silicon-based semiconductor material; and at least one of the first and second parts is made of a dielectric material which includes silicon oxide, silicon carbide nitride, silicon nitride, hafnium silicate, hafnium oxide, lanthanum oxide, lanthanum aluminum oxide, aluminum oxide, yttrium oxide, zirconium oxide, tantalum oxide, niobium oxide, titanium oxide, barium titanate, strontium titanate, or combinations thereof.

In accordance with some embodiments of the present disclosure, a method for manufacturing a semiconductor structure includes: forming a first stack and a second stack, the first and second stacks being spaced apart from each other by a gap, each of the first and second stacks including a plurality of channel layers, each of the channel layers having an end portion exposed from the gap; and forming a dielectric wall in the gap, the dielectric wall having a first part which is in direct contact with the end portions of the channel layers of the first stack, and a second part which is in direct contact with the end portions of the channel layers of the second stack, at least one of the first and second parts carrying positive or negative charges.

In accordance with some embodiments of the present disclosure, forming the dielectric wall includes: forming the first part of the dielectric wall to cover the end portions of the channel layers of the first stack; and forming the second part of the dielectric wall to cover the end portions of the channel layers of the second stack.

In accordance with some embodiments of the present disclosure, the first part is formed prior to forming the second part.

In accordance with some embodiments of the present disclosure, the first part is made of a material different from that of the second part.

In accordance with some embodiments of the present disclosure, forming the dielectric wall further includes forming a middle part between the first and second parts; the first and second parts are formed simultaneously and are made of a first dielectric material; and the middle part is formed after forming the first and second parts, and is made of a second dielectric material different from the first dielectric material.

In accordance with some embodiments of the present disclosure, each of the channel layers is made of a silicon-based semiconductor material; and at least one of the first and second parts is made of a dielectric material which induces the positive or negative charges at least at an interface of the silicon-based semiconductor material and the dielectric material.

In accordance with some embodiments of the present disclosure, the dielectric material includes silicon oxide, silicon carbide nitride, silicon nitride, hafnium silicate, hafnium oxide, lanthanum oxide, lanthanum aluminum oxide, aluminum oxide, yttrium oxide, zirconium oxide, tantalum oxide, niobium oxide, titanium oxide, barium titanate, strontium titanate, or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first device unit and a second device unit that are spaced apart from each other in a first direction, each of the first device unit and the second device unit includes channel features that are spaced apart from each other in a second direction different from the first direction, each of the channel features having a first end portion and a second end portion opposite to each other in the first direction; and
a dielectric wall disposed between the first device unit and the second device unit, the dielectric wall including
a first part interfacing the channel features of the first device unit, the first end portion of each of the channel features of the first device unit being covered by the first part, the second end portion of each of the channel features of the first device unit being distal from the dielectric wall, and
a second part interfacing the channel features of the second device unit, the first end portion of each of the channel features of the second device unit being covered by the second part, the second end portion of each of the channel features of the second device unit being distal from the dielectric wall,
at least one of the first part or the second part carrying positive charges or negative charges.

2. The semiconductor structure according to claim 1, wherein when the first device unit is an n-type device, the first part of the dielectric wall carries the negative charges.

3. The semiconductor structure according to claim 2, wherein the first part of the dielectric wall is made of an aluminum-based dielectric material.

4. The semiconductor structure according to claim 1, wherein when the second device unit is a p-type device, the second part of the dielectric wall carries the positive charges.

5. The semiconductor structure according to claim 4, wherein the second part of the dielectric wall is made of a silicon-based dielectric material, a lanthanum-based dielectric material, hafnium silicate, lanthanum-doped hafnium oxide, or combinations thereof.

6. The semiconductor structure according to claim 1, wherein an amount of the positive charges or negative charges present in the at least one of the first part or the second part of the dielectric wall ranges from $1\times10^{11}$ C/cm$^2$ to $1\times10^{13}$ C/cm$^2$.

7. The semiconductor structure according to claim 1, wherein the first part and the second part of the dielectric wall are made of different materials.

8. A semiconductor assembly comprising two semiconductor structures, each including:
a first device unit and a second device unit that are spaced apart from each other in a first direction, each of the first device unit and the second device unit including channel features that are spaced apart from each other in a second direction different from the first direction, each of the channel features having a first end portion and a second end portion that are opposite to each other in the first direction, and a first surface and a second surface that are opposite to each other in the second direction,
a gate electrode extending around the channel features in a manner that the gate electrode covers the first surface, the second surface and the second end portion of each of the channel features, and
a gate dielectric disposed to separate the channel features from the gate electrode; and
a dielectric wall disposed between the first device unit and the second device unit, and including
a first part interfacing the first end portion of each of the channel features of the first device unit, and
a second part interfacing the first end portion of each of the channel features of the second device unit,
in at least one of the two semiconductor structures, at least one of the first part or the second part including a material that corresponds to a conductivity type of a corresponding one of the first device unit and the second device unit.

9. The semiconductor assembly according to claim 8, wherein
the first device unit and the second device unit of one of the two semiconductor structures are each an n-type device, while the first device unit and the second device unit of the other one of the two semiconductor structures are each a p-type device; and
the dielectric wall of the one of the two semiconductor structures includes a material different from a material of the dielectric wall of the other one of the two semiconductor structures.

10. The semiconductor assembly according to claim 8, wherein the first part and the second part of the dielectric wall of one of the two semiconductor structures together form a U-shape cross-section.

11. The semiconductor assembly according to claim 8, wherein
the first part and the second part of the dielectric wall of one of the two semiconductor structures are made of a first dielectric material;
the dielectric wall of the one of the two semiconductor structures further includes a middle part which is disposed between the first part and the second part, and which is made of a second dielectric material different from the first dielectric material; and
the dielectric wall of the other one of the two semiconductor structures is made of the second dielectric material.

12. The semiconductor assembly according to claim 8, wherein
the first part of the dielectric wall is made of a first dielectric material; and the second part of the dielectric wall is made of a second dielectric material different from the first dielectric material.

13. The semiconductor assembly according to claim 8, wherein each of the channel features is made of a silicon-based semiconductor material; and at least one of the first part or the second part is made of a dielectric material which includes silicon oxide, silicon carbide nitride, silicon nitride, hafnium silicate, hafnium oxide, lanthanum oxide, lanthanum aluminum oxide, aluminum oxide, yttrium oxide, zirconium oxide, tantalum oxide, niobium oxide, titanium oxide, barium titanate, strontium titanate, or combinations thereof.

14. A method for manufacturing a semiconductor structure, comprising:

forming a first stack and a second stack, the first stack and the second stack being spaced apart from each other by a gap, each of the first stack and the second stack including channel layers and sacrificial layers that are disposed to alternate with the channel layers, each of the channel layers having a first end portion facing the gap and a second end portion opposite to the first end portion;

forming a dielectric wall in the gap, the dielectric wall having a first part which interfaces the first end portion of each of the channel layers of the first stack, and a second part which interfaces the first end portion of each of the channel layers of the second stack, at least one of the first part or the second part carrying positive charges or negative charges;

after forming the dielectric wall, removing the sacrificial layers; and after removing the sacrificial layers, forming gate electrodes respectively around the channel layers of the first stack and the second stack.

15. The method according to claim 14, wherein forming the dielectric wall includes:

forming the first part of the dielectric wall to cover the first end portion of each of the channel layers of the first stack; and forming the second part of the dielectric wall to cover the first end portion of each of the channel layers of the second stack.

16. The method according to claim 15, wherein the first part is formed prior to forming the second part, and forming the first part includes forming a first dielectric material layer along a contour of the first stack and the second stack, forming a masking material layer to cover a first portion of the first dielectric material layer that covers a portion of the first stack in the gap, a second portion of the first dielectric material layer being exposed from the masking material layer, removing the second portion of the first dielectric material layer to leave the first portion of the first dielectric material layer which serves as the first part of the dielectric wall, and removing the masking material layer after removing the second portion of the first dielectric material layer.

17. The method according to claim 16, wherein the first part is made of a material different from a material of the second part.

18. The method according to claim 15, wherein forming the dielectric wall further includes forming a middle part between the first part and the second part;

the first part and the second part are formed simultaneously and are made of a first dielectric material; and the middle part is formed after forming the first part and the second part, and is made of a second dielectric material different from the first dielectric material.

19. The method according to claim 14, wherein each of the channel layers is made of a silicon-based semiconductor material; and at least one of the first part or the second part is made of a dielectric material which induces the positive charges or negative charges at least at an interface of the silicon-based semiconductor material and the dielectric material.

20. The method according to claim 19, wherein the dielectric material includes silicon oxide, silicon carbide nitride, silicon nitride, hafnium silicate, hafnium oxide, lanthanum oxide, lanthanum aluminum oxide, aluminum oxide, yttrium oxide, zirconium oxide, tantalum oxide, niobium oxide, titanium oxide, barium titanate, strontium titanate, or combinations thereof.

\* \* \* \* \*